(12) United States Patent
Du et al.

(10) Patent No.: US 11,231,349 B1
(45) Date of Patent: Jan. 25, 2022

(54) INTELLIGENT SYSTEM AND METHOD FOR PREPARING CRYO-ELECTRON MICROSCOPY SAMPLES AND ELECTRONIC DEVICE

(71) Applicant: INSTITUTE OF GEOLOGY AND GEOPHYSICS, CHINESE ACADEMY OF SCIENCES, Beijing (CN)

(72) Inventors: Zhongming Du, Beijing (CN); Jijin Yang, Beijing (CN); Wenjie Dong, Beijing (CN)

(73) Assignee: INSTITUTE OF GEOLOGY AND GEOPHYSICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 17/394,429

(22) Filed: Aug. 5, 2021

(30) Foreign Application Priority Data

Jun. 15, 2021 (CN) .......................... 202110658431.7

(51) Int. Cl.
*G01N 1/42* (2006.01)
*G01N 1/32* (2006.01)
*G01N 1/28* (2006.01)

(52) U.S. Cl.
CPC ................ *G01N 1/42* (2013.01); *G01N 1/32* (2013.01); *G01N 2001/2873* (2013.01)

(58) Field of Classification Search
CPC ..... G01N 1/42; G01N 1/32; G01N 2001/2873
See application file for complete search history.

(56) References Cited

U.S. PATENT DOCUMENTS

| 4,563,883 A * | 1/1986 | Sitte ......................... G01N 1/42 141/284 |
| 2021/0108997 A1* | 4/2021 | Kim ......................... G01N 1/06 |

* cited by examiner

*Primary Examiner* — Paul M. West
(74) *Attorney, Agent, or Firm* — Bayramoglu Law Offices LLC

(57) ABSTRACT

An intelligent system and method for preparing cryo-electron microscopy samples is provided. The system includes a control center, an ultra-low temperature liquid tank, a sample holding mechanism configured to limit a position of a to-be-processed sample, a sample processing mechanism configured to cut or polish the sample, a position adjustment mechanism, and a sample transfer mechanism configured to transfer a processed sample. In a working process, the control center controls the ultra-low temperature liquid tank to provide a preset temperature environment based on a target sample type, activates the position adjustment mechanism based on position information of the sample holding mechanism in the first chamber to drive the sample processing mechanism to perform processing according to a preset processing route, and activates, based on information about the processed sample to be transferred into the second chamber, the sample transfer mechanism to transfer the processed sample in a preset environment.

17 Claims, 10 Drawing Sheets

INTELLIGENT SYSTEM AND METHOD FOR PREPARING CRYO-ELECTRON MICROSCOPY SAMPLES AND ELECTRONIC DEVICE

CROSS REFERENCE TO THE RELATED APPLICATIONS

This application is based upon and claims priority to Chinese Patent Application No. 202110658431.7, filed on Jun. 15, 2021, the entire contents of which are incorporated herein by reference.

TECHNICAL FIELD

The present invention relates to the technical field of scanning electron microscopy (SEM), and specifically, to an intelligent system and method for preparing cryo-electron microscopy samples and an electronic device.

BACKGROUND

Cryo-cutting/polishing devices are used to cut a sample and polish its cross-section in a low-temperature freezing environment, which is suitable as a pre-processing device for surfaces of cryo-SEM observed samples.

The sample chamber of the conventional scanning electron microscope requires a high vacuum environment, which requires the observed samples to be dry and non-volatile. However, many samples contain water or oil or have volatility, and thus cannot meet the use conditions of the conventional electron microscope. In addition, the loss of water and oil will change the structure and nature of the samples, causing the test data to be distorted. The cryo-scanning electron microscope developed in recent years makes it possible, through the ultra-low temperature sample table, to observe natural gas hydrates, oily rocks, biological cells, suspensions, hydrogels and other water-containing or oil-containing samples that cannot be observed by conventional electron microscopes. During preparation of cryo-SEM samples, in order to maintain the original structure and composition characteristics of the above samples, the refrigerant is required to quickly freeze the samples and help them remain in a frozen state throughout the process. In addition, the prepared samples must be kept in vacuum during the transfer process. Although the vacuum state can prevent contaminants and moisture from adhering to surfaces of the samples, it limits the use of conventional cutting and polishing devices for electron microscopy samples. Currently, the cryo-SEM samples are mainly prepared through freeze-brittle fracture. To be specific, the samples are fixed in a low-temperature freezing state, and the samples are impacted by using a freezing cutter to obtain a fresh section. This method has two problems: first, the section position is random, which is not conducive to target analysis; second, the surface is rough, which increases the observation difficulty and prevents automatic analysis and statistics.

SUMMARY

In order to resolve the above problems, that is, to resolve the problems of poor sample cross-section quality and low position accuracy of the existing equipment for preparing cryo-electron microscopy samples, the present invention provides an intelligent system and method for preparing cryo-electron microscopy samples and an electronic device.

A first aspect of the present invention provides an intelligent system for preparing cryo-electron microscopy samples. The system includes a control center, an ultra-low temperature liquid tank, a sample holding mechanism, a sample processing mechanism, a position adjustment mechanism and a sample transfer mechanism, and the ultra-low temperature liquid tank, the sample holding mechanism, the sample processing mechanism, the position adjustment mechanism and the sample transfer mechanism are all signally connected to the control center.

The ultra-low temperature liquid tank includes a liquid tank body for holding liquid nitrogen to provide an ultra-low temperature environment required for samples; the liquid tank body includes a bottom wall and a side wall, and the bottom wall and the side wall constitute a chamber with an upward opening; the bottom wall includes a first bottom wall and a second bottom wall, the first bottom wall is provided with a first mounting portion for installing the sample holding mechanism, and the second bottom wall is provided with a second mounting portion matched with the sample transfer mechanism; a partition is arranged between the first bottom wall and the second bottom wall, the partition and the first bottom wall constitute a first chamber, and the partition and the second bottom wall constitute a second chamber.

The sample holding mechanism is configured to limit a position of a to-be-processed sample; the sample transfer mechanism is configured to transfer the processed sample in a preset environment; the position adjustment mechanism is configured to adjust horizontal and vertical positions of the sample processing mechanism; the sample processing mechanism is configured to cut or polish the sample.

In a working process, the control center controls the ultra-low temperature liquid tank to provide a preset temperature environment based on a target sample type, activates the position adjustment mechanism based on position information of the sample holding mechanism in the first chamber to drive the sample processing mechanism to perform processing according to a preset processing route, and activates, based on information about the processed sample to be transferred into the second chamber, the sample transfer mechanism to transfer the processed sample in the preset environment.

In some preferred embodiments, the sample holding mechanism includes a sample table, a base and a base pressing plate, the sample table includes a disc carrier and a connecting rod, and the connecting rod is arranged below the disc carrier.

The base includes a first disc-shaped structure and a second disc-shaped structure arranged below the first disc-shaped structure, and the horizontal area of the second disc-shaped structure is larger than the horizontal area of the first disc-shaped structure; a circular chamber for holding the disc carrier is arranged in the first disc-shaped structure, and a fixing portion matched with the connecting rod is arranged in the circular chamber.

A side of the first disc-shaped structure is provided with a first limiting through hole and a second limiting through hole, the first limiting through hole is arranged opposite to the second limiting through hole, and a first limiting member and a second limiting member are respectively arranged in the first limiting through hole and the second limiting through hole to clamp or loosen the disc carrier.

The first mounting portion is a protruding limiting groove, and the second disc-shaped structure is rotatably arranged in the protruding limiting groove; a first protruding shaft is arranged in the middle of the protruding limiting groove, and a limiting hole matched with the first protruding shaft is arranged at the bottom of the second disc-shaped structure.

The base pressing plate is installed on the top of the second disc-shaped structure to press or loosen the base.

In some preferred embodiments, the connecting rod is a threaded rod, and the fixing portion is a threaded hole.

The disc carrier is provided with a sample connecting groove, and the depth of the sample connecting groove is less than the thickness of the disc carrier; a longitudinal axis of the sample connecting groove and a longitudinal axis of the connecting rod are arranged at a preset angle.

The disc carrier is further provided with a plurality of clamping holes, a plurality of sample connecting grooves are arranged, and the plurality of clamping holes and the plurality of sample connecting grooves do not interfere with each other.

A side wall of the base pressing plate is provided with a first protruding portion and a second protruding portion, the first protruding portion is arranged opposite to the second protruding portion; the thickness of the second protruding portion is less than the thickness of the first protruding portion; a side of the protruding limiting groove is provided with a third protruding portion and a fourth protruding portion, and the third protruding portion is arranged opposite to the fourth protruding portion; the first protruding portion abuts against the third protruding portion, and the second protruding portion and the fourth protruding portion are arranged with a gap; in a working state, the second protruding portion and the fourth protruding portion are connected through a bolt to press or loosen the base.

In some preferred embodiments, the position adjustment mechanism is installed on a top cover of the liquid tank body, the position adjustment mechanism includes a horizontal adjustment device and a vertical adjustment device, and the horizontal adjustment device and the vertical adjustment device are both signally connected to the control center.

The horizontal adjustment device includes a horizontal movement assembly, a first power device and a first connecting assembly, the horizontal movement assembly includes a first horizontal movement device and a second horizontal movement device, the first horizontal movement device and the second horizontal movement device are respectively fixedly arranged at two ends of the first connecting assembly; the top cover of the liquid tank body is provided with a first horizontal guide rail matched with the first horizontal movement device, and a second horizontal guide rail matched with the second horizontal movement device; in the working state, the first horizontal movement device is driven by the first power device to move along the first horizontal guide rail, and to drive the second horizontal movement device to move along the second horizontal guide rail.

The vertical adjustment device includes a vertical movement assembly, a second power device, and a second connecting assembly, the vertical movement assembly includes a first lifting device and a second lifting device, the first lifting device and the second lifting device are respectively arranged above the first horizontal movement device and the second horizontal movement device; the first lifting device includes a first connecting and fixing portion, a screw rod and a limiting and connecting portion, and the first connecting and fixing portion is provided with a through hole that threadedly matches the screw rod; the second lifting device includes a guide rail, one end of the second connecting assembly is fixedly connected to the first connecting and fixing portion, and the other end of the second connecting assembly is engaged with the guide rail; in the working process, the screw rod is driven by the second power device to drive the first connecting and fixing portion to rise and fall to further control the second connecting assembly to rise and fall.

The sample processing mechanism is installed on the second connecting assembly.

In some preferred embodiments, the sample processing mechanism includes a processing power device, a transmission device, a bracket, and a processing assembly, and the transmission device is installed at a power output end of the processing power device; the transmission device is fixed to the bracket through the processing power device; the processing assembly is installed at a power output end of the transmission device.

The bracket has an engagement and fixing portion, and the sample processing mechanism is fixedly connected to the second connecting assembly through the engagement and fixing portion; a detection device is arranged on the bracket, and the detection device is a pressure detection device for detecting a working pressure or a torque detection device for detecting torque.

The processing assembly includes a clamp and a cutter, and the cutter is installed on the transmission device through the clamp; the transmission device is driven by the processing power device to drive the cutter to cut or polish the sample.

In some preferred embodiments, a temperature detection device and a heating device are arranged on the bracket, and the temperature detection device and the heating device are both signally connected to the control center; when temperature information detected by the temperature detection device exceeds a preset threshold, the control center activates the heating device to adjust a temperature of the sample processing mechanism.

In some preferred embodiments, a first temperature detection module is arranged inside the first chamber, and the first temperature detection module is signally connected to the control center to detect temperature information inside the first chamber.

An isolation cover is arranged on the top of the second chamber, a second temperature detection module and a temperature control module are arranged on the isolation cover, the second temperature detection module and the temperature control module are both signally connected to the control center; in the working process, the control center controls the temperature control module to perform temperature adjustment based on abnormal temperature information detected by the second temperature detection module.

In some preferred embodiments, the sample transfer mechanism includes a sample fixing mechanism, a transmission mechanism and a vacuum docking mechanism, and both the transmission mechanism and the vacuum docking mechanism communicate with the control center; the sample fixing mechanism includes a transfer table base and a transfer device; the second mounting portion is an inclined groove, the transfer table base is fixed to the inclined groove, and the transfer device is movably installed on the top of the transfer table base, to fix the processed sample.

The transmission mechanism includes a transmission rod, a movement device and a rotation device, the movement device includes a first power device, a first transmission assembly, a transmission screw rod, a transfer rod slide rail, a movement slide block and a limiting slide block, the first transmission assembly is installed at a power output end of the first power device, the transmission screw rod is installed at a power output end of the first transmission assembly; the transfer rod slide rail has a cylindrical structure, and the movement slide block and the limiting slide block are both installed inside the cylindrical structure; the limiting slide block is rotatably connected to the transfer rod slide rail, the transmission rod penetrates the limiting slide block and is rotatably connected to the movement slide block, and the transmission rod is fixedly connected to the limiting slide block; a side of the movement slide block is provided with a rail connecting portion, and an inner wall of the transfer rod slide rail is provided with a rail engagement portion matched with the rail connecting portion; a rotation engagement portion is arranged on a side of the limiting slide block away from the movement slide block; the movement slide block is provided with a screw rod transmission portion matched with the transmission screw rod.

The rotation device includes a second power device and a second transmission assembly, the second transmission assembly is arranged at a power output end of the second power device; the second transmission assembly is provided with a rotation docking portion matched with the rotation engagement portion; the transmission rod penetrates the rotation docking portion.

The vacuum docking mechanism is hung on a front wall of the liquid tank body, and the vacuum docking mechanism is configured to provide an environment required for the samples and bear a transferred sample; the front wall of the liquid tank body is provided with a through hole for holding the transmission rod; the transfer power device is installed on a side of the vacuum docking mechanism away from the liquid tank body.

In a first operation state, the movement slide block, the limiting slide block and the transmission rod constitute a movement assembly; in a second operation state, the limiting slide block is fixedly engaged with the second transmission assembly, and the transmission rod, the limiting slide block and the second transmission assembly constitute a rotation assembly.

In the first operation state, the movement assembly is driven by the first power device to move along a longitudinal direction of the transmission rod to a first preset position, where an end of the transmission rod away from the first power device is docked with the transfer device at the first preset position, and the limiting slide block is fixedly engaged with the second transmission assembly; in the second operation state, the rotation assembly is driven by the second power device to rotate to a second preset position, where the end of the transmission rod away from the first power device is fixedly engaged with the transfer device at the second preset position; in a third operation state, the transfer device carries the sample and is driven by the first power device to move away from a chamber of a sample preparation device to the vacuum docking mechanism.

A second aspect of the present invention provides an intelligent method for preparing cryo-electron microscopy samples, where the method is based on the intelligent system for preparing cryo-electron microscopy samples described above, and specifically includes the following steps: step S100: fixing a to-be-processed sample in the sample holding mechanism, and controlling, by the control center, the ultra-low temperature liquid tank to provide the preset temperature environment based on the target sample type; step S200: controlling, by the control center, the ultra-low temperature liquid tank to provide ultra-low temperature liquid, and allow a liquid level of the ultra-low temperature liquid to be higher than the to-be-processed sample; step S300: controlling the position adjustment mechanism to adjust the position of the sample processing mechanism; controlling the sample processing mechanism to process the sample according to the preset processing route and a preset processing requirement; and step S400: transferring the processed sample inside the first chamber to the second chamber in the preset environment to complete preparing the cryo-electron microscopy samples.

A third aspect of the present invention provides an electronic device, including: at least one processor and a memory communicating with the at least one processor, where instructions configured to be executed by the processor are stored in the memory, and the instructions are configured to be executed by the processor to implement the intelligent method for preparing cryo-electron microscopy samples described above.

1) The present invention can achieve precise positioning and cut or polish cryo-electron microscopy samples with a certain loss and thickness, which reduces sample loss; it can provide high-quality cryo-electron microscopy samples at specific positions and with high flatness and large areas, which reduces the observation difficulty and facilitates automatic statistics and analysis; the sample transfer mechanism can avoid changing the structure and property of the samples or prevent the samples from being contaminated, to provide real cryo-electron microscopy samples.

2) The intelligent system for preparing cryo-electron microscopy samples disclosed in the present invention can provide a low-temperature freezing environment that maintains the structure and composition characteristics of the samples, and can obtain the cross-section of the sample at a fixed position and polish the cross-section, to facilitate subsequent observation in the cryo-scanning electron microscopes and data collection and analysis.

BRIEF DESCRIPTION OF THE DRAWINGS

Other features, objectives and advantages of this application will become more apparent upon reading the detailed description of the non-restrictive embodiments with reference to the following accompanying drawings.

Figure 1:
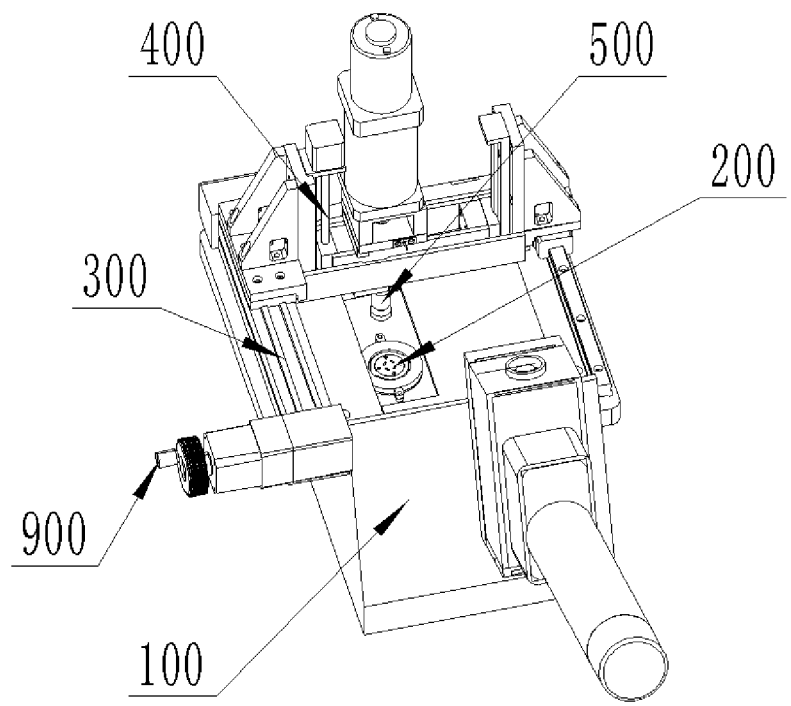
FIG. 1 is a stereoscopic view of a specific embodiment of an intelligent system for preparing cryo-electron microscopy samples according to the present invention.

Reference numerals: 100: ultra-low temperature liquid tank; 110: liquid tank body; 120: top cover; 121: first horizontal guide rail; 122: second horizontal guide rail; 130: peripheral temperature insulating layer; 140: carrier device; 141: first chamber; 1411: first mounting portion; 1412: third protruding portion, 1413: fourth protruding portion; 142: second chamber; 1421: second mounting portion; 143: partition; 144: third mounting portion.

200: sample holding mechanism; 210: sample table; 211: disc carrier; 212: connecting rod; 213: inclined keyway; 214: clamping hole; 220: base; 221: first disc-shaped structure; 2211: fixing portion; 2212: first limiting through hole; 2213: second limiting through hole; 222: second disc-shaped structure; 230: base pressing plate; 231: first protruding portion; 232: second protruding portion.

300: horizontal adjustment device; 310: first horizontal movement device; 320: second horizontal movement device; 330: first connecting assembly; 340: first power device.

400: vertical adjustment device; 410: first lifting device; 411: screw rod; 412: first connecting and fixing portion; 413: limiting and connecting portion; 420: second lifting device; 430: second connecting assembly; 440: second power device.

500: sample processing mechanism; 510: high-frequency motor; 520: drive spindle; 530: detection device; 540: clamp; 550: cutter; 560: bracket; 561: engagement and fixing portion.

600: sample fixing mechanism; 610: transfer table base; 620: transfer device; 621: transfer body; 622: first connecting hole; 623: second connecting hole; 624: third connecting hole; 625: first plunger spring body; 626: second plunger spring body; 6261: second protrusion.

700: transmission mechanism; 710: transmission rod; 711: first limiting section; 712: engagement section; 7121: engagement portion; 713: second limiting section; 714: transmission rod body; 721: first power device; 722: first drive gear; 723: second drive gear; 724: transmission screw rod; 725: transfer rod slide rail; 7251: first engagement protrusion; 7252: second engagement protrusion; 7253: rail; 726: movement slide block; 7261: movement limiting portion; 7262: first slide rail engagement portion; 7263: second slide rail engagement portion; 7264: transmission rod connecting portion; 7265: elastic member connecting portion; 7266: screw rod transmission portion; 727: limiting slide block; 7271: rotation engagement portion; 7272: rotation groove; 728: elastic connecting member; 731: second power device, 732: third drive gear; 733: fourth drive gear; 734: accommodation housing.

800: vacuum docking mechanism; 810: docking and engagement mechanism; 820: transfer box housing; 821: magnetic fluid sealed bearing; 830: liquid nitrogen storage tank; 840: heat insulation base; 851: first vacuum gate valve; 852: second vacuum gate valve; 860: vacuum pump opening/closing port; 870: liquid nitrogen pump opening and closing port; 880: fixing base; 881: transfer box vacuum chamber; 890: liquid nitrogen tank; 900: manual rotation portion.

DETAILED DESCRIPTION OF THE EMBODIMENTS

In order to make the embodiments, technical solutions and advantages of the present invention clearer, the technical solutions of the present invention are clearly and completely described below with reference to the accompanying drawings. Apparently, the described embodiments are a part rather than all of the embodiments. Those skilled in the art should understand that the implementations herein are merely intended to explain the technical principles of the present invention, rather than to limit the protection scope of the present invention.

A first aspect of the present invention provides an intelligent system for preparing cryo-electron microscopy samples. The system includes a control center, an ultra-low temperature liquid tank, a sample holding mechanism, a sample processing mechanism, a position adjustment mechanism and a sample transfer mechanism. The ultra-low temperature liquid tank, the sample holding mechanism, the sample processing mechanism, the position adjustment mechanism and the sample transfer mechanism are all signally connected to the control center. The ultra-low temperature liquid tank includes a liquid tank body for holding liquid nitrogen to provide an ultra-low temperature environment required by the samples.

The liquid tank body includes a bottom wall and a side wall, and the bottom wall and the side wall constitute a chamber with an upward opening; the bottom wall includes a first bottom wall and a second bottom wall, the first bottom wall is provided with a first mounting portion for installing the sample holding mechanism, and the second bottom wall is provided with a second mounting portion matched with the sample transfer mechanism; a partition is arranged between the first bottom wall and the second bottom wall, the partition and the first bottom wall constitute a first chamber, and the partition and the second bottom wall constitute a second chamber. The sample holding mechanism is configured to limit a position of a to-be-processed sample; the sample transfer mechanism is configured to transfer a processed sample in a preset environment; the position adjustment mechanism is configured to adjust horizontal and vertical positions of the sample processing mechanism; the sample processing mechanism is configured to cut or polish the sample. In a working process, the control center controls the ultra-low temperature liquid tank to provide a preset temperature environment based on a target sample type, activates the position adjustment mechanism based on position information of the sample holding mechanism in the first chamber to drive the sample processing mechanism to perform processing according to a preset processing route, and activates, based on information about the processed sample to be transferred into the second chamber, the sample transfer mechanism to transfer the processed sample in the preset environment. The system arranged in the present invention can realize fixed surface processing of samples, accurately obtain the samples required for target analysis, and facilitate subsequent sample observation and research. In addition, the present invention can realize large area and precise positioning, cutting and polishing of cryo-electron microscopy samples. Furthermore, during sample transfer, it can avoid changing the structure and property of the samples or prevent the samples from being contaminated.

The intelligent system for preparing cryo-electron microscopy samples arranged in the present invention can effectively resolve the problem of severe frosting on the surface of the samples during processing, can effectively ensure that the samples are in a preset environment during the manufacturing and transfer process, and will not cause changes in the structure and property of the samples. In addition, the present invention can realize the processing of various types of samples.

The present invention is described in further detail with reference to the accompanying drawings and specific embodiments.

Figure 2:
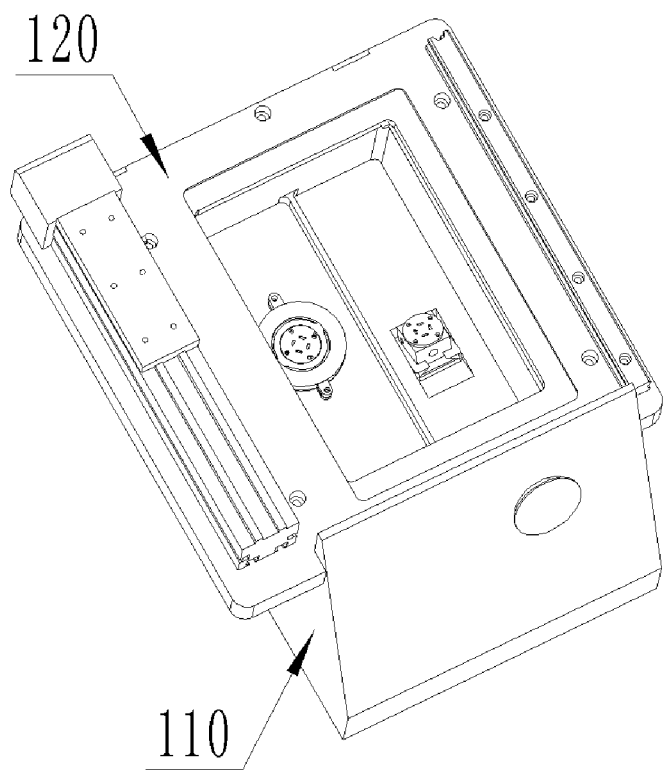
FIG. 2 is a stereoscopic view of a specific embodiment of an ultra-low temperature liquid tank in FIG. 1.

Referring to FIG. 1 and FIG. 2, FIG. 1 is a stereoscopic view of a specific embodiment of an intelligent system for preparing cryo-electron microscopy samples according to the present invention, and FIG. 2 is a stereoscopic view of a specific embodiment of an ultra-low temperature liquid tank in FIG. 1. A first aspect of the present invention provides an intelligent system for preparing cryo-electron microscopy samples. The system includes a control center, an ultra-low temperature liquid tank 100, a sample holding mechanism 200, a sample processing mechanism 500, a position adjustment mechanism, and a sample transfer mechanism. The ultra-low temperature liquid tank, the sample holding mechanism, the sample processing mechanism, the position adjustment mechanism, and the sample transfer mechanism are all signally connected to the control center. The position adjustment mechanism includes a horizontal adjustment device 300 and a vertical adjustment device 400. The ultra-low temperature liquid tank includes a liquid tank body 110 for holding liquid nitrogen to provide an ultra-low temperature environment required for samples; the liquid tank body includes a bottom wall and a side wall, and the bottom wall and the side wall constitute a chamber with an upward opening; the bottom wall includes a first bottom wall and a second bottom wall, the first bottom wall is provided with a first mounting portion for installing the sample holding mechanism, and the second bottom wall is provided with a second mounting portion matched with the sample transfer mechanism; a partition is arranged between the first bottom wall and the second bottom wall, the partition and the first bottom wall constitute a first chamber, and the partition and the second bottom wall constitute a second chamber.

The sample holding mechanism is configured to limit a position of a to-be-processed sample; the sample transfer mechanism is configured to transfer the processed sample in a preset environment; the position adjustment mechanism is configured to adjust horizontal and vertical positions of the sample processing mechanism; the sample processing mechanism is configured to cut or polish the sample. In a working process, the control center controls the ultra-low temperature liquid tank to provide a preset temperature environment based on a target sample type, activates the position adjustment mechanism based on position information of the sample holding mechanism in the first chamber to drive the sample processing mechanism to perform processing according to a preset processing route, and activates, based on information about the processed sample to be transferred into the second chamber, the sample transfer mechanism to transfer the processed sample in the preset environment.

The ultra-low temperature liquid tank (namely, ultra-low temperature liquid nitrogen tank) accurately provides the ultra-low temperature environment required by the samples to maintain the structure and property of the samples, while also cool the heat generated by cutting/polishing and lubricate the cutting/polishing surface. The sample holding mechanism is arranged relative to the cutting/polishing mechanism, and is configured to maintain a relative relationship between the sample and the cutting/polishing mechanism during cutting; the sample transfer mechanism is configured to transfer the sample to prevent the sample from heating up and causing changes in the structure or property, or is configured to open a freezing environment to transfer severe icing pollution.

Figure 3:
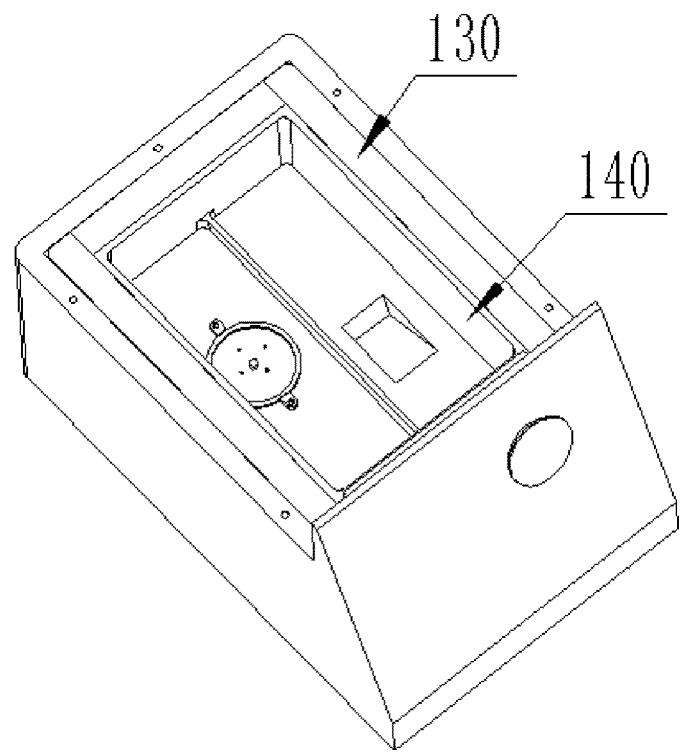
FIG. 3 is a stereoscopic view of another specific embodiment of the ultra-low temperature liquid tank in FIG. 1.
Figure 4:
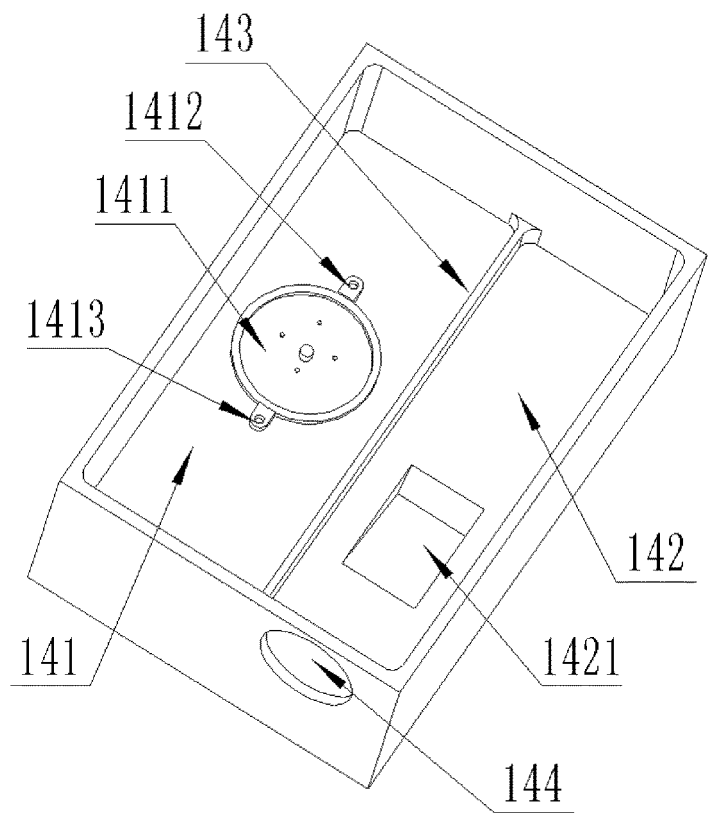
FIG. 4 is a stereoscopic view of a specific embodiment of a carrier device in FIG. 3.

Preferably, referring to FIG. 3 and FIG. 4, FIG. 3 is a stereoscopic view of another specific embodiment of the ultra-low temperature liquid tank in FIG. 1, and FIG. 4 is a stereoscopic view of a specific embodiment of a carrying device in FIG. 3. In this embodiment, a carrying device 140 is arranged inside the chamber, a peripheral temperature insulation layer 130 is arranged between the carrying device and a side wall of the chamber, and a bottom wall of the carrying device matches a bottom wall of the chamber. The bottom wall of the carrying device includes a first bottom wall and a second bottom wall, the first bottom wall is provided with a first mounting portion 1411 for installing the sample holding mechanism, and the second bottom wall is provided with a second mounting portion 1421 matching the sample transfer mechanism; a partition 143 is arranged between the first bottom wall and the second bottom wall, the partition and the first bottom wall constitute a first chamber 141, and the partition and the second bottom wall constitute a second chamber 142; a third mounting portion 144 through which the transmission rod penetrates is arranged on a front wall of the carrying device.

Preferably, the first mounting portion 1411 is a protruding limiting groove; a side of the protruding limiting groove is provided with a third protruding portion 1412 and a fourth protruding portion 1413, and the third protruding portion is arranged opposite to the fourth protruding portion.

Preferably, the height of the partition is the same as the height of the sample grinding and polishing surface that is set on the sample table, to ensure that the debris does not enter the second chamber when processing is performed in the first chamber. That is, the height of the partition=the height of the sample table+the thickness of the sample. The sample thickness in this application generally does not exceed 5 mm.

Further, referring to FIG. 2 to FIG. 7, the sample holding mechanism includes a sample table 210, a base 220, and a base pressing plate 230. The sample table includes a disc carrier 211 and a connecting rod 212, and the connecting rod is arranged below the disc carrier. The base includes a first disc-shaped structure 221 and a second disc-shaped structure 222 arranged below the first disc-shaped structure, the horizontal area of the second disc-shaped structure is greater than the horizontal area of the first disc-shaped structure; a circular chamber for holding the disc carrier is arranged in the first disc-shaped structure, and a fixing portion 2211 matched with the connecting rod is arranged in the circular chamber. The base pressing plate is installed on the top of the second disc-shaped structure to press or loosen the base.

A side of the first disc-shaped structure is provided with a first limiting through hole 2212 and a second limiting through hole 2213, the first limiting through hole is arranged opposite to the second limiting through hole, and a first limiting member and a second limiting member are respectively arranged in the first limiting through hole and the second limiting through hole to clamp or loosen the disc carrier.

The second disc-shaped structure is rotatably arranged in the protruding limiting groove 1411; a first protruding shaft is arranged in the middle of the protruding limiting groove, and a limiting hole matched with the first protruding shaft is arranged at the bottom of the second disc-shaped structure. When the base pressing plate is pressed, the base can flexibly rotate in the protruding limiting groove to adjust the position.

Figure 5:
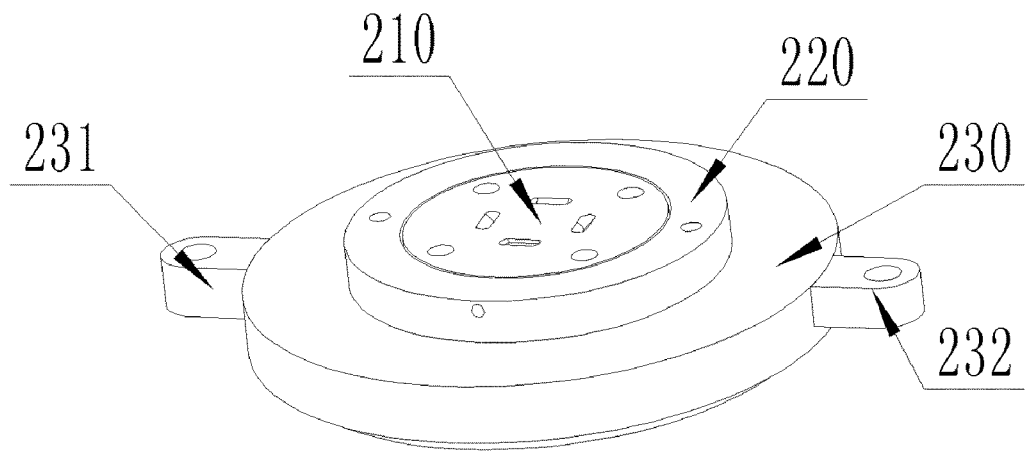
FIG. 5 is a stereoscopic view of a specific embodiment of a sample holding mechanism in FIG. 1.
Figure 6:
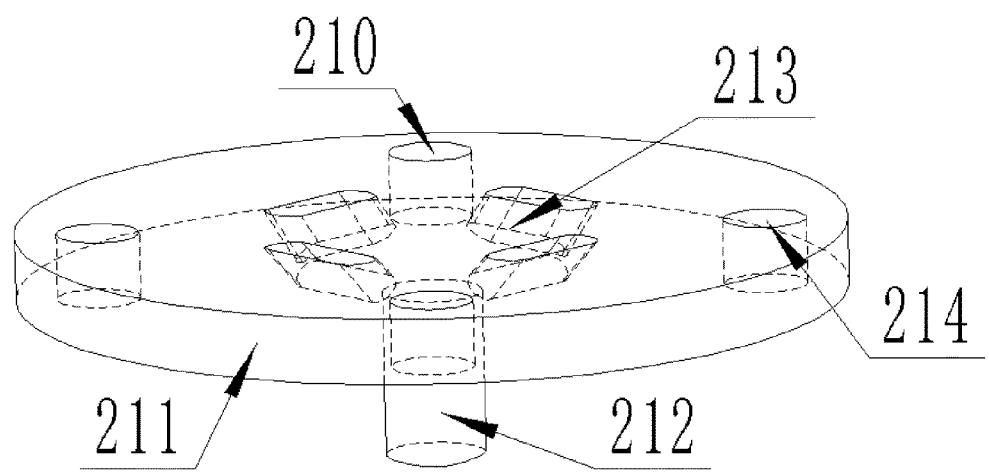
FIG. 6 is a stereoscopic view of a specific embodiment of a sample table in FIG. 5.
Figure 7:
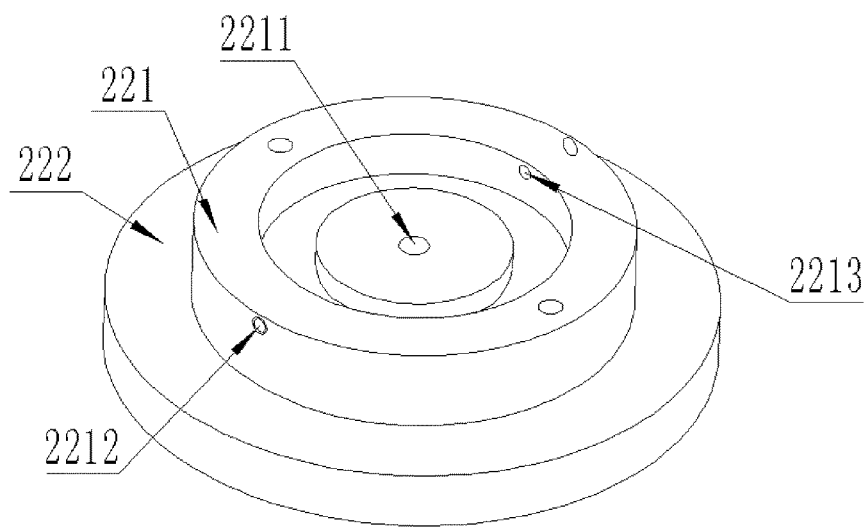
FIG. 7 is a stereoscopic view of a specific embodiment of a base in FIG. 5.
Figure 21:
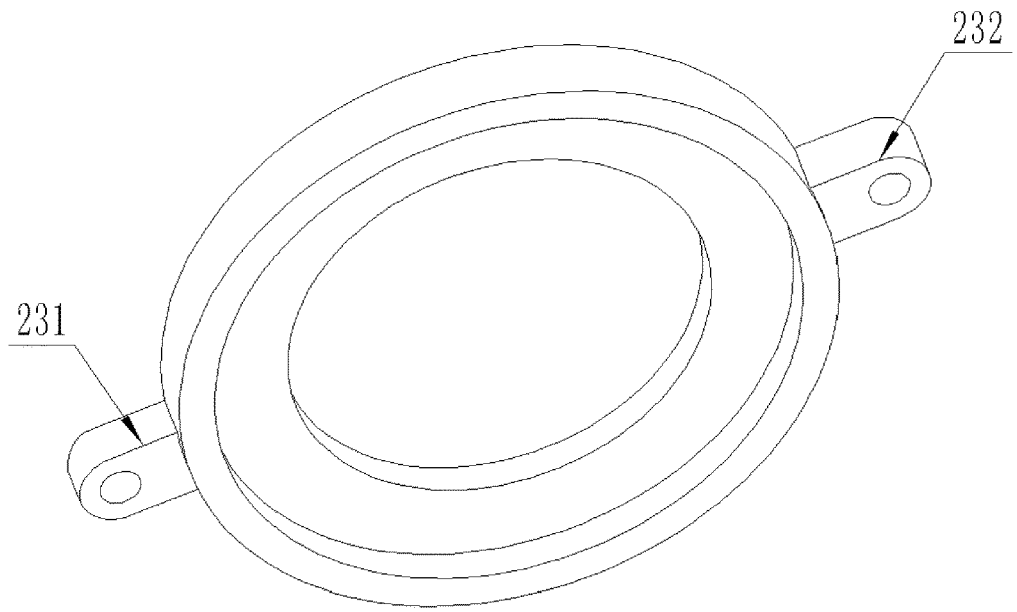
FIG. 21 is a stereoscopic view of a specific embodiment of a base pressing plate in FIG. 5.

Further, referring to FIG. 5 and FIG. 21, FIG. 21 is a stereoscopic view of a specific embodiment of the base pressing plate in FIG. 5. A side wall of the base pressing plate is provided with a first protruding portion 231 and a second protruding portion 232, and the first protruding portion is arranged opposite to the second protruding portion; the thickness of the second protruding portion is less than the thickness of the first protruding portion; the first protruding portion abuts against a third protruding portion, and the second protruding portion and a fourth protruding portion are arranged with a gap, to ensure that when the base pressing plate is installed to the first mounting portion, the assembly pressure may be flexibly adjusted through the second protruding portion and the fourth protruding portion that are arranged with the gap; in a working state, the second protruding portion and the fourth protruding portion are connected through a bolt to press or loosen the base. The base pressing plate includes a top plate with a through hole and an annular side plate. The through hole of the top plate is larger than the outer diameter of the first disc-shaped structure, and the outer diameter of the annular top plate is larger than the outer diameter of the second disc-shaped structure. When the base pressing plate is installed to the first mounting portion, the rotation position of the base can be flexibly adjusted with a 360° rotation range through the second protruding portion and the fourth protruding portion that are arranged with the gap. Furthermore, the first limiting through hole and the second limiting through hole on the side of the first disc-shaped structure can be used to fix the sample table and the base, that is, flexibly adjust the position of the sample table, thereby further improving the processing precision.

Preferably, the connecting rod is a threaded rod; the fixing portion is a threaded hole; the disc carrier is provided with a sample connecting groove, and the depth of the sample connecting groove is less than the thickness of the disc carrier; a longitudinal axis of the sample connecting groove and a longitudinal axis of the connecting rod are arranged at a preset angle. That is, the sample connecting groove is an inclined keyway 213. In this embodiment, the sample is usually bonded to the sample table. The glue used for bonding can be any water-containing glue to ensure that the sample does not fall off the sample table. The inclined keyway is provided to ensure that the glue has a limiting effect inside the inclined keyway. Therefore, even if the sample is subjected to external force, it can be effectively fixed to the sample table.

The disc carrier is further provided with a plurality of clamping holes 214, a plurality of sample connecting grooves are arranged, and the plurality of clamping holes and the plurality of sample connecting grooves do not interfere with each other.

Figure 9:
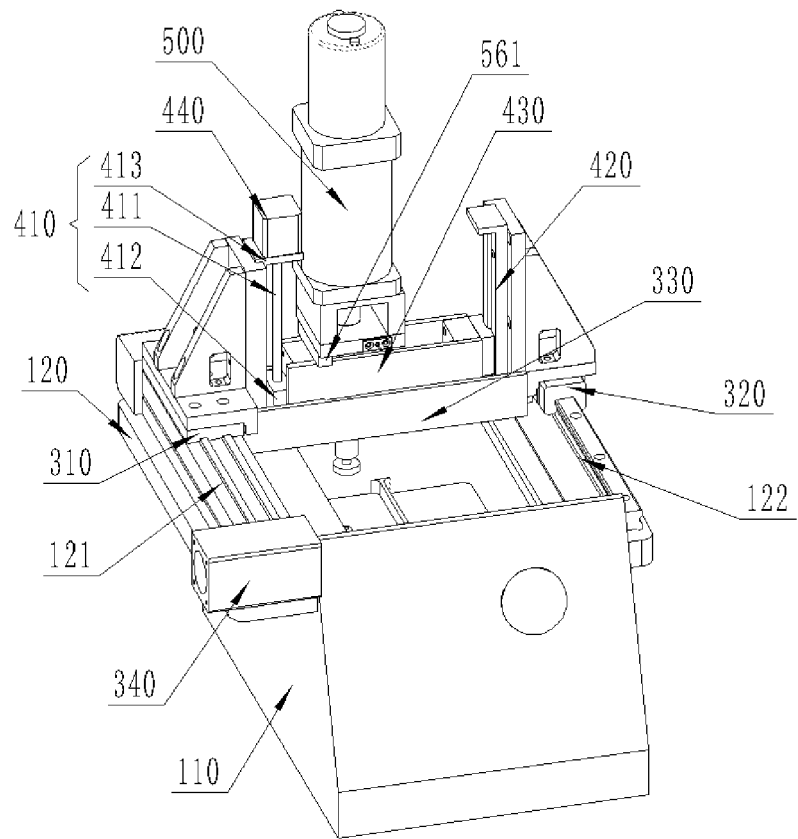
FIG. 9 is a stereoscopic view of a specific embodiment of a position adjustment mechanism in FIG. 1.

Referring to FIG. 2 and FIG. 9, FIG. 9 is a stereoscopic view of a specific embodiment of the position adjustment mechanism in FIG. 1. The position adjustment mechanism is installed on the top cover 120 of the liquid tank body, and the horizontal adjustment device and the vertical adjustment device are both signally connected to the control center; the horizontal adjustment device includes a horizontal movement assembly, a first power device and a first connecting assembly, the horizontal movement assembly includes a first horizontal movement device 310 and a second horizontal movement device 320, the first horizontal movement device and the second horizontal movement device are respectively fixedly arranged at two ends of the first connecting assembly 330; the top cover of the liquid tank body is provided with a first horizontal guide rail 121 matched with the first horizontal movement device, and a second horizontal guide rail 122 matched with the second horizontal movement device; in the working state, the first horizontal movement device is driven by the first power device 340 to move along the first horizontal guide rail, and to drive the second horizontal movement device to move along the second horizontal guide rail.

The vertical adjustment device includes a vertical movement assembly, a second power device and a second connecting assembly, the vertical movement assembly includes a first lifting device 410 and a second lifting device 420, the first lifting device and the second lifting device are respectively arranged above the first horizontal movement device and the second horizontal movement device; the first lifting device includes a first connecting and fixing portion 412, a screw rod 411 and a limiting and connecting portion 413, and the first connecting and fixing portion is provided with a through hole that threadedly matches the screw rod; the second lifting device includes a guide rail, one end of the second connecting assembly 430 is fixedly connected to the first connecting and fixing portion, and the other end of the second connecting assembly 430 is engaged with the guide rail; in the working process, the screw rod is driven by the second power device 440 to drive the first connecting and fixing portion to rise and fall to further control the second connecting assembly to rise and fall.

Furthermore, the sample processing mechanism is installed on the second connecting assembly 430.

Figure 8:
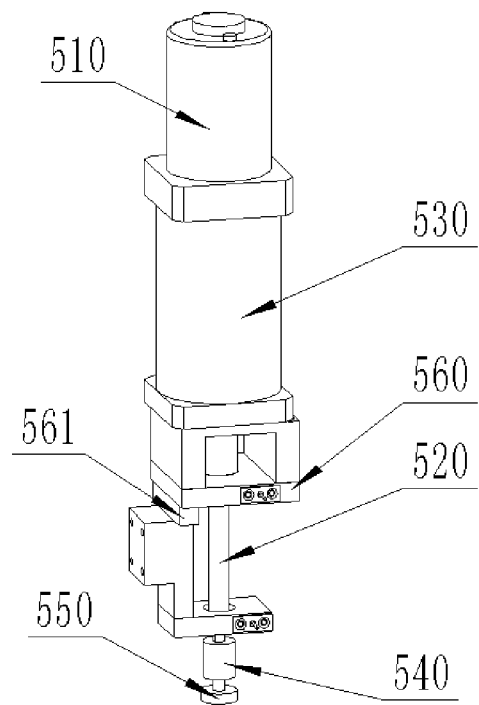
FIG. 8 is a stereoscopic view of a specific embodiment of a sample processing mechanism in FIG. 1.

FIG. 8 is stereoscopic view of a specific embodiment of the sample processing mechanism in FIG. 1. The sample processing mechanism includes a processing power device (namely, a high-frequency motor 510), a transmission device (namely, a drive spindle 520), a bracket 560 and a processing assembly, and the transmission device is installed at a power output end of the processing power device; the transmission device is fixed to the bracket through the processing power device; the processing assembly is installed at a power output end of the transmission device.

The bracket has an engagement and fixing portion 561, and the sample processing mechanism is fixedly connected to the second connecting assembly through the engagement and fixing portion. The processing assembly includes a clamp 540 and a cutter 550. The cutter is installed on the drive spindle through the clamp; the transmission device is driven by the processing power device to drive the cutter to cut or polish the sample.

Further, a detection device 530 is arranged on the bracket, and the detection device is a pressure detection device for detecting a working pressure or a torque detection device for detecting torque. In this embodiment, the detection device is a torque sensor.

Preferably, a temperature detection device and a heating device are arranged on the bracket, and the temperature detection device and the heating device are both signally connected to the control center; when temperature information detected by the temperature detection device exceeds a preset threshold, the control center activates the heating device to adjust a temperature of the sample processing mechanism.

Preferably, a first temperature detection module is arranged inside the first chamber, and the first temperature detection module is signally connected to the control center to detect temperature information inside the first chamber. An isolation cover is arranged on the top of the second chamber, a second temperature detection module and a temperature control module are arranged on the isolation cover, the second temperature detection module and the temperature control module are both signally connected to the control center; in the working process, the control center controls the temperature control module to perform temperature adjustment based on abnormal temperature information detected by the second temperature detection module. The temperature control module is arranged on the isolation cover to prevent frost damage to the operation personnel.

Preferably, the isolation cover is a glass cover, and the glass cover is arranged to slow down the volatilization speed of liquid nitrogen and the condensation of water vapor in the air on the cutting/polishing mechanism.

Figure 10:
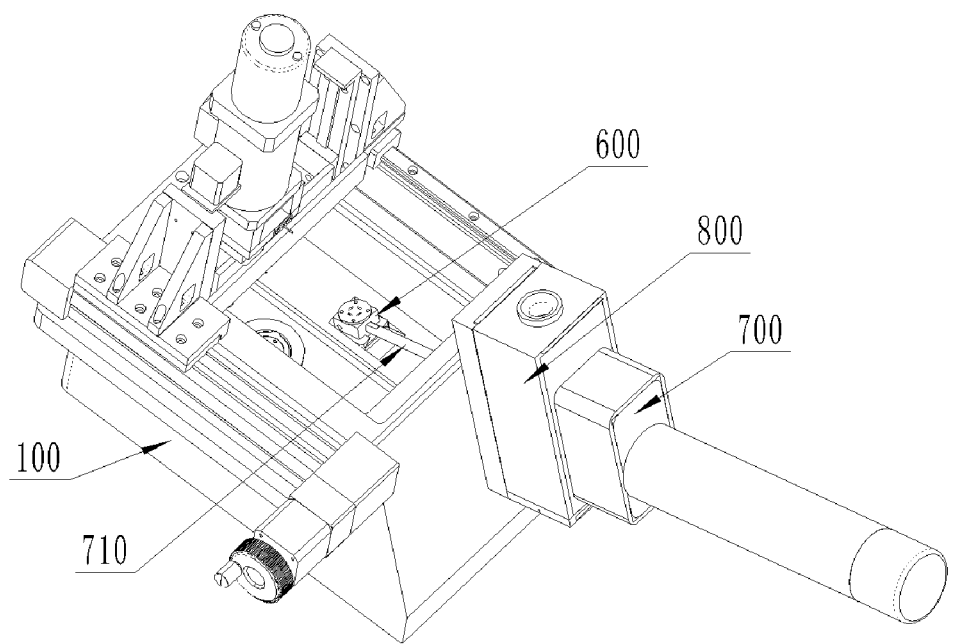
FIG. 10 is a stereoscopic view of a specific embodiment of a sample transfer mechanism in a working state in FIG. 1.

FIG. 10 is a stereoscopic view of a specific embodiment of the sample transfer mechanism in FIG. 1 in the working state. The sample transfer mechanism includes a sample fixing mechanism 600, a transmission mechanism 700, and a vacuum docking mechanism 800, both the transmission mechanism and the vacuum docking mechanism communicate with the control center; the sample fixing mechanism includes a transfer table base and a transfer device; the second mounting portion is an inclined groove, the transfer table base is fixed to the inclined groove, and the transfer device is movably installed on the top of the transfer table base, to fix the processed sample; the transmission mechanism includes a transmission rod 710 and a transfer power device, the transmission rod can move inward or outward relative to the second chamber under the drive of the transfer power device; one end of the transmission rod is detachably connected to the transfer device. The vacuum docking mechanism is hung on a front wall of the liquid tank body, and the vacuum docking mechanism is configured to provide an environment required for the samples and bear a transferred sample; the front wall of the liquid tank body is provided with a through hole for holding the transmission rod; the transfer power device is installed on a side of the vacuum docking mechanism away from the liquid tank body. In the working process, the transmission rod can pass through the vacuum docking mechanism under the drive of the transfer power device, and is fixedly connected to the transfer device through the through hole, to transfer the sample.

Preferably, the inclined surface of the inclined groove is arranged parallel to the longitudinal axis of the transmission rod.

Figure 11:
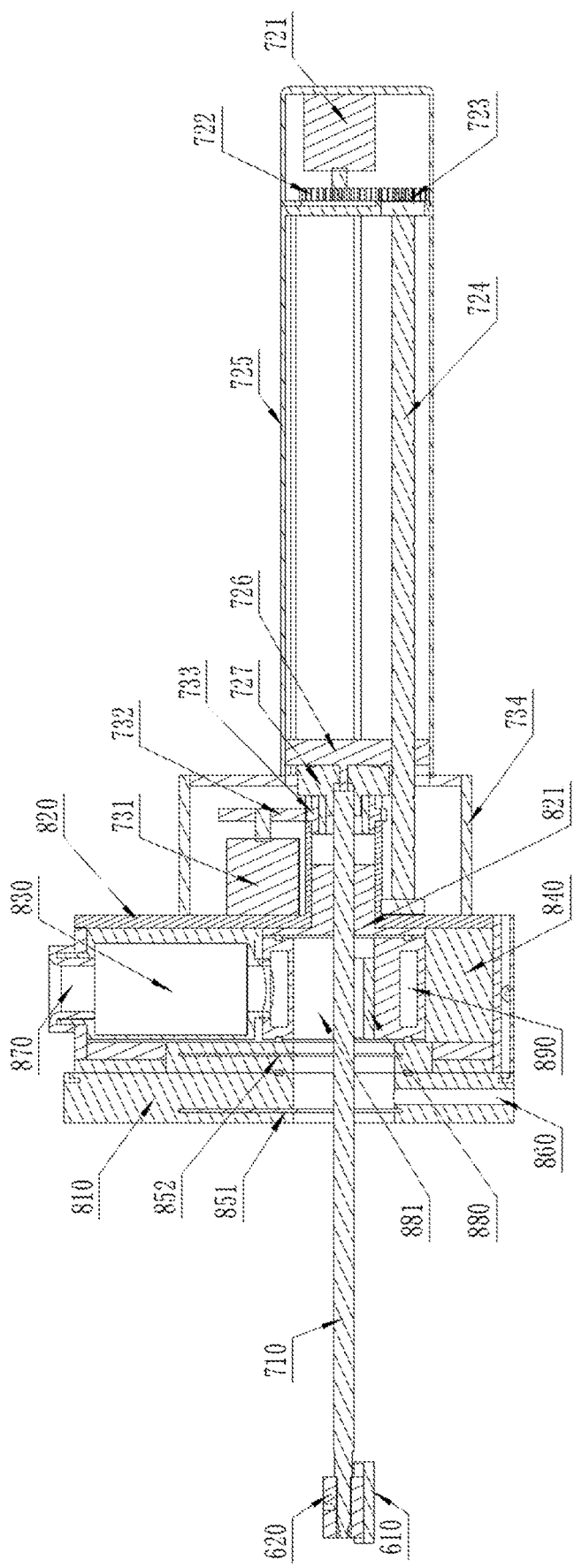
FIG. 11 is a cross-sectional view of a specific embodiment of a sample transfer mechanism in FIG. 2.
Figure 12:
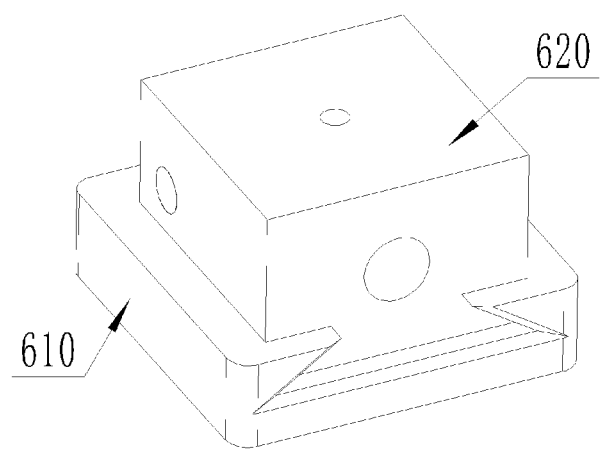
FIG. 12 is a stereoscopic view of a specific embodiment of a sample fixing mechanism in FIG. 11.
Figure 13:
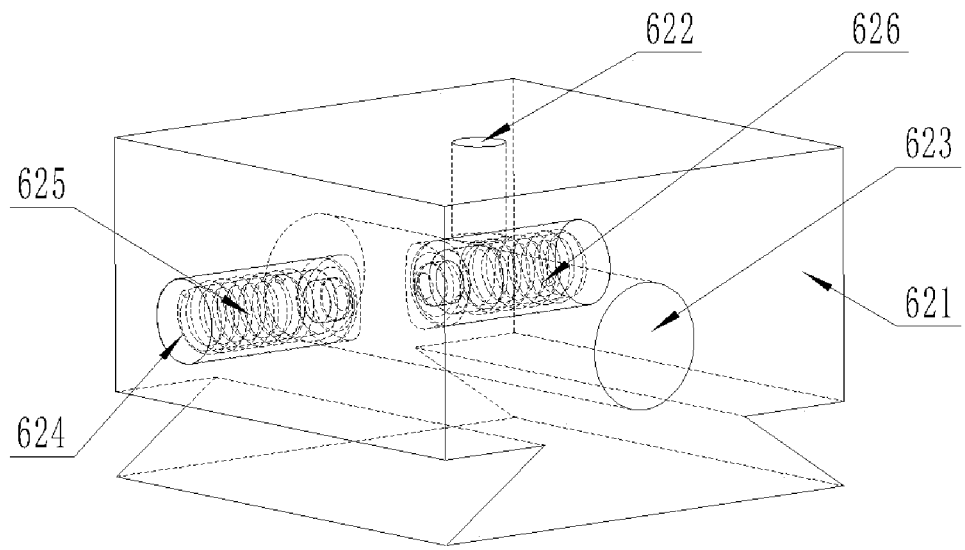
FIG. 13 is a perspective view of a specific embodiment of the sample fixing mechanism in FIG. 11.
Figure 14:
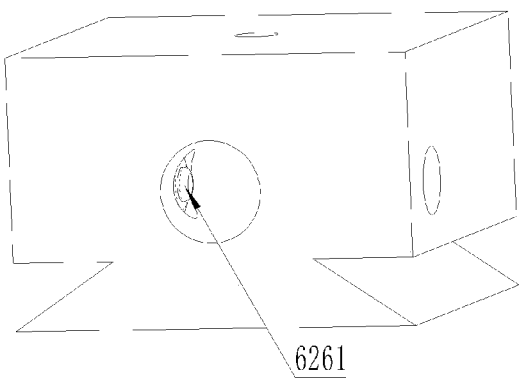
FIG. 14 is a schematic view of the sample fixing mechanism in FIG. 11 from another perspective.
Figure 20:
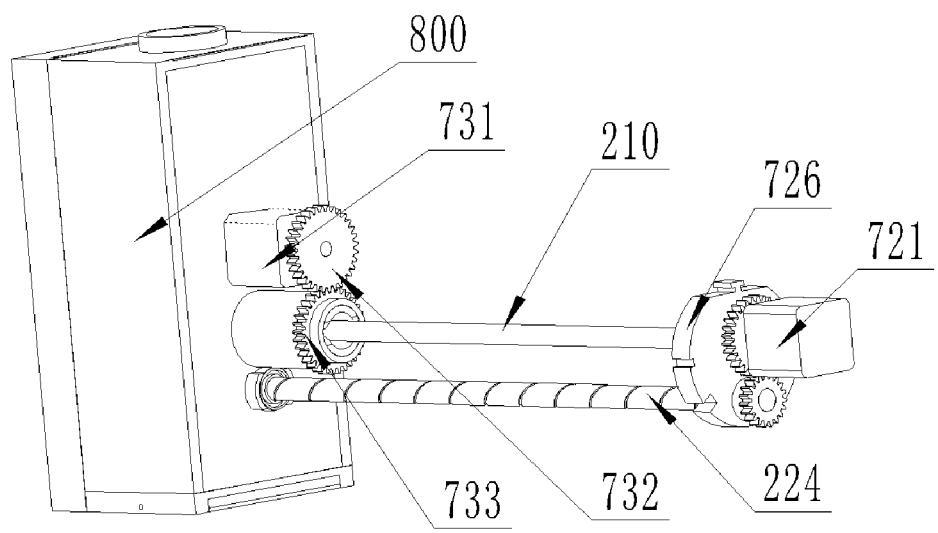
FIG. 20 is a partial schematic structural diagram of a transmission mechanism in FIG. 11 in a first operation state.

Referring to FIG. 10, FIG. 11 and FIG. 20, FIG. 11 is a cross-sectional view of a specific embodiment of the sample transfer mechanism according to the present invention, and FIG. 20 is partial schematic structural diagram of a transmission mechanism in FIG. 11 in a first operation state. The sample transfer mechanism is configured to transfer the prepared cryo-electron microscopy sample from the chamber of the ultra-low temperature liquid tank 100. The inner bottom wall of the chamber is provided with an inclined groove that facilitates transferring of the cryo-electron microscopy sample, and the sample transfer mechanism includes a sample fixing mechanism 600, a transmission mechanism 700 and a vacuum docking mechanism 800, both the transmission mechanism and the vacuum docking mechanism communicate with the control center; the sample fixing mechanism includes a transfer table base 610 and a transfer device 620; the transfer table base is fixed in the inclined groove; the transfer device is arranged above the transfer table base, and the transfer device is slidably connected to the transfer table base.

The transmission mechanism includes a transmission rod 710, a movement device and a rotation device. The movement device includes a first power device 721, a first transmission assembly, a transmission screw rod 724, a transfer rod slide rail 725, a movement slide block 726 and a limiting slide block 727. The first transmission assembly is installed at a power output end of the first power device, and the transmission screw rod is installed at a power output end of the first transmission assembly.

The transfer rod slide rail has a cylindrical structure, and the movement slide block and the limiting slide block are both installed inside the cylindrical structure; the limiting slide block is rotatably connected to the transfer rod slide rail, the transmission rod penetrates the limiting slide block and is rotatably connected to the movement slide block, and the transmission rod is fixedly connected to the limiting slide block; a side of the movement slide block is provided with a rail connecting portion, and an inner wall of the transfer rod slide rail is provided with a rail engagement portion matched with the rail connecting portion; a rotation engagement portion 7271 is arranged on a side of the limiting slide block away from the movement slide block; the movement slide block is provided with a screw rod transmission portion matched with the transmission screw rod.

The rotation device includes a second power device 731 and a second transmission assembly, the second transmission assembly is arranged at a power output end of the second power device; the second transmission assembly is provided with a rotation docking portion matched with the rotation engagement portion; the transmission rod penetrates the rotation docking portion; the rotation device is installed in the accommodating housing 734, and the accommodating housing is installed outside the vacuum docking mechanism.

In a first operation state, the movement slide block 726, the limiting slide block and the transmission rod 710 constitute a movement assembly; in a second operation state, the limiting slide block is fixedly engaged with the second transmission assembly, and the transmission rod, the limiting slide block and the second transmission assembly constitute a rotation assembly. To be specific, in the first operation state, the movement assembly is driven by the first power device to move along a longitudinal direction of the transmission rod to a first preset position, where an end of the transmission rod away from the first power device is docked with the transfer device at the first preset position, and the limiting slide block is fixedly engaged with the second transmission assembly; in the second operation state, the rotation assembly is driven by the second power device to rotate to a second preset position, where the end of the transmission rod away from the first power device is fixedly engaged with the transfer device at the second preset position; in a third operation state, the transfer device carries the sample and is driven by the first power device to move away from a chamber of a sample preparation device to the vacuum docking mechanism.

Further, referring to FIG. 11 to FIG. 14, the top of the transfer table base is provided with a dovetail groove; the transfer device includes a transfer body 621, the top of the transfer body is provided with a first connecting hole 622 for fixing the sample, and the bottom of the transfer body is provided with a convex engagement portion matching the dovetail groove; a front side of the transfer body is provided with a second connecting hole 623 for the transmission rod to pass through; left and right sides of the transfer body are respectively provided with a third connecting hole 624 and a fourth connecting hole for respectively accommodating a first plunger spring body 625 and a second plunger spring body 626, the first plunger spring body is arranged opposite to the second plunger spring body; an end of the first plunger spring body is provided with a first protrusion, an end of the second plunger spring body is provided with a second protrusion 6261, and in the extended state, the distance between the first protrusion and the second protrusion is smaller than the outer diameter of the transmission rod.

Figure 15:
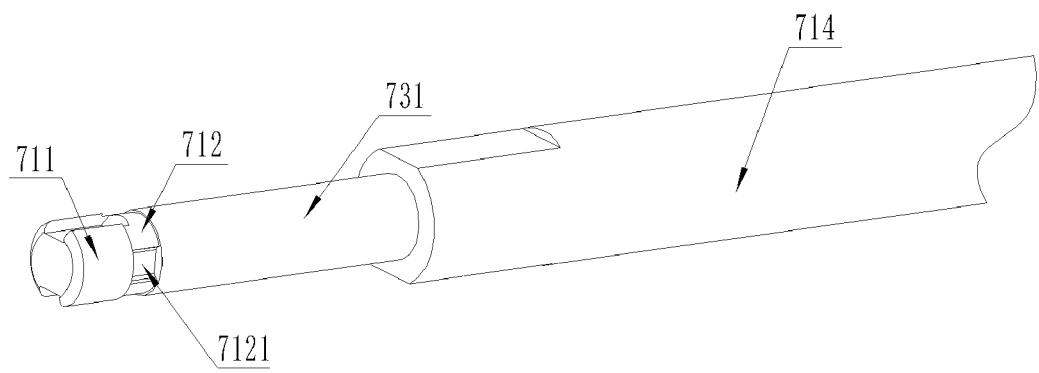
FIG. 15 is a partial schematic view of a specific embodiment of a transmission rod in FIG. 11.
Figure 16:
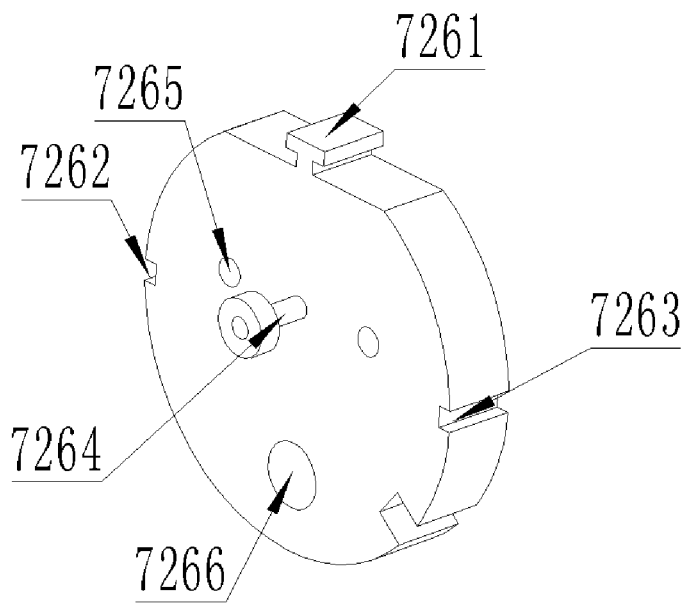
FIG. 16 is a stereoscopic view of a specific embodiment of a movement slide block in FIG. 11.

Referring to FIG. 11 and FIG. 15, the transmission rod includes a transmission rod body 714, a first end and a second end, the first end is to be engaged with the sample base, and the second end is to be rotatably connected to the movement slide block; the first end includes a first limiting section 711, an engagement section 712 and a second limiting section 713, the engagement section is arranged between the first limiting section and the second limiting section; the outer diameter of the first limiting section is D1, the outer diameter of the engagement section is D2, and the outer diameter of the second limiting section is D3, D1>D2, and D3>D2.

Further, the engagement section includes an arc area and a plane area, the arc area includes a first arc portion and a second arc portion that are opposed to each other, the plane area includes a first plane portion and a second plane portion that are opposed to each other, the first arc portion is arranged between the first plane portion and the second plane portion, the first plane portion and the second plane portion constitute two engagement portions 7121 of the first plunger spring body and the second plunger spring body in the transmission rod and the transfer device.

In the present invention, in the first operation state, the movement assembly is driven by the first power device to move along the longitudinal direction of the transmission rod to the first preset position, where an end of the transmission rod away from the first power device is docked with the transfer device at the first preset position, and the limiting slide block is fixedly engaged with the second transmission assembly. The engagement herein means that the two arc areas of the transmission rod respectively abut against the first protrusion of the first plunger spring body and the second protrusion of the second plunger spring body. In the second operation state, the rotation assembly is driven by the second power device to rotate to the second preset position, where the end of the transmission rod away from the first power device is fixedly engaged with the transfer device at the second preset position. In this embodiment, to rotate by 90°, the two plane areas of the transmission rod respectively abut against the first protrusion of the first plunger spring body and the second protrusion of the second plunger spring body; the first limiting section and the second limiting section on the transmission rod ensure the transmission rod to be engaged with and fixed to the transfer device.

Figure 17:
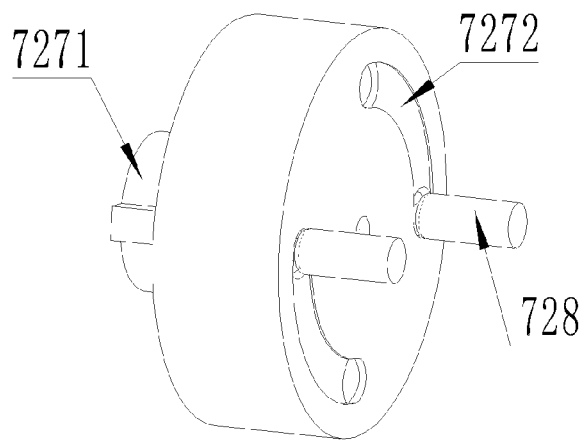
FIG. 17 is a stereoscopic view of a specific embodiment of a limiting slide block in FIG. 11.
Figure 18:
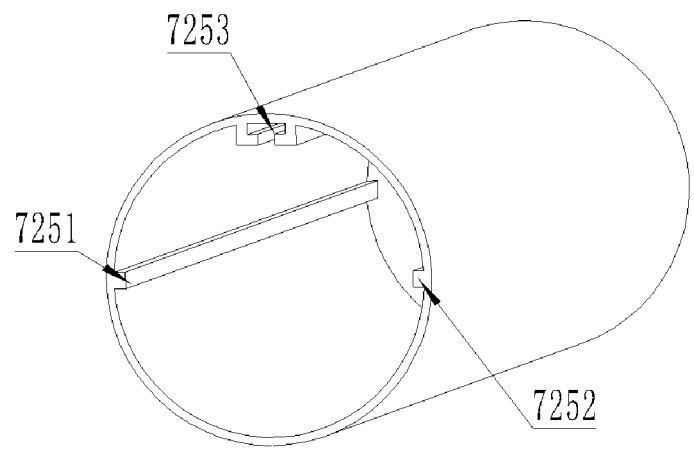
FIG. 18 is a stereoscopic view of a specific embodiment of a transfer rod slide rail in FIG. 11.

Referring to FIG. 11 and FIG. 16 to FIG. 18, FIG. 16 is a stereoscopic view of a specific embodiment of the movement slide block in FIG. 11, FIG. 17 is a stereoscopic view of a specific embodiment of the limiting slide block in FIG. 11, and FIG. 18 is a stereoscopic view of a specific embodiment of the transfer rod slide rail in FIG. 11. The rail connecting portion includes a movement limiting portion 7261, a first slide rail engagement portion 7262 and a second slide rail engagement portion 7263; the rail engagement portion includes a rail 7253 matched with the movement limiting portion, a first engagement protrusion 7251 matched with the first slide rail engagement portion, and a second engagement protrusion 7252 matched with the second slide rail engagement portion; the movement limiting portion is a T-shaped protrusion, and the rail is a T-shaped groove; the first slide rail engagement portion is a first groove; the second slide rail engagement portion is a second groove; the longitudinal axis of the T-shaped groove, the longitudinal axis of the first engagement protrusion and the longitudinal axis of the second engagement protrusion are parallel to the longitudinal axis of the transmission rod.

Further, the screw rod transmission portion 7266 is a threaded through hole.

A side of the movement slide block away from the first power device is also provided with an elastic member connecting portion 7265 and a transmission rod connecting portion 7264 that is rotatably connected to the second end of the transmission rod; a side of the limiting slide block away from the second power device is provided with a rotation groove 7272, and an elastic connecting member 728 is arranged in the rotation groove; in the assembled state, an end of the elastic connecting member away from the rotation groove is fixedly connected to the elastic member connecting portion; an end of the elastic connecting member away from the movement slide block is slidably connected to the rotation groove.

Preferably, the rotation groove is a kidney groove, the maximum angle at which the elastic connecting member rotates in the kidney groove is θ1, and the rotation angle at which the transmission rod rotates from the first operation state to the second operation state is θ2, and θ1=θ2.

Preferably, θ1=θ2=90°.

Preferably, the first transmission assembly includes a first drive gear 722 and a second drive gear 723, the first drive gear is fixed to the power output shaft of the first power device, and the second drive gear meshes with the first drive gear; an end of the transmission screw rod is fixedly connected to the second drive gear; the second transmission assembly includes a third drive gear 732 and a fourth drive gear 733, the third drive gear is fixed to the power output shaft of the second power device, and the fourth drive gear meshes with the third drive gear; the rotation docking portion is arranged on a side of the fourth drive gear that faces the first power device, which is the right side in this embodiment.

Figure 19:
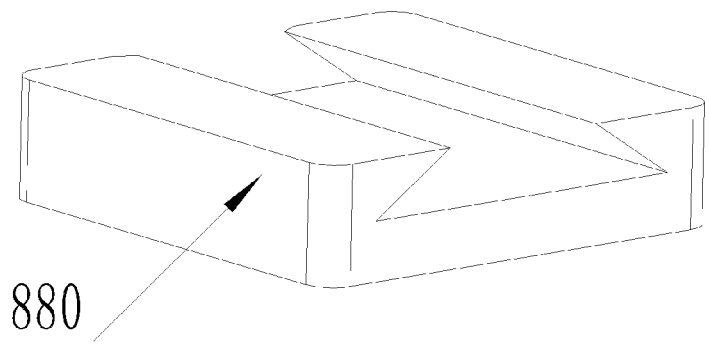
FIG. 19 is a stereoscopic view of a specific embodiment of a fixing base in FIG. 11.

Referring to FIG. 11, FIG. 19 and FIG. 20, the vacuum docking mechanism includes a docking and engagement mechanism 810 and a transfer box housing 820, and the docking and engagement mechanism is configured to be connected to the outer wall of the sample preparation device; the transfer box housing is arranged between the docking and engagement mechanism and the accommodating housing 734; the transfer box housing is provided with a first through hole and a second through hole for the transmission rod to pass through, and a vacuum gate valve is arranged between the first through hole and the docking and engagement mechanism, to control connection between the inside of the transfer box housing and the docking and engagement mechanism, the vacuum gate valve is signally connected to the control center; a magnetic fluid sealed bearing 821 is arranged between the second through hole and the accommodating housing.

A vacuum pump opening/closing port 860 is arranged on a side of the docking and engagement mechanism, and is used for vacuuming the inside of the docking and engagement mechanism.

The inside of the transfer box housing is a hollow chamber, and an inner wall of the hollow chamber is provided with a heat insulation base 840 to maintain the temperature inside the hollow chamber. Preferably, the hollow chamber is a transfer box vacuum chamber 881; a liquid nitrogen storage tank 830 is arranged inside of the heat insulation base, to adjust the internal temperature of the hollow chamber, and the top of the hollow chamber is provided with a liquid nitrogen pump opening/closing port 870 to transport liquid nitrogen.

A fixing base 880 is further arranged inside the hollow chamber, to limit the position of the transfer device for carrying the sample; the fixed base and the transfer table base have the same structure, that is, a dovetail groove is arranged on the top to match the transfer device, to limit positions in the up and down directions.

Furthermore, a liquid nitrogen groove 890 is arranged inside the heat insulation base, and the liquid nitrogen groove surrounding the vacuum sample chamber can achieve rapid cooling, to adjust and control of the temperature of the sample transferred into the hollow chamber.

Preferably, the distance between the outer wall of the transfer box housing and the connecting portion between the transmission rod and the second drive gear is greater than the length of the transmission rod.

Preferably, the vacuum gate valve includes a first vacuum gate valve 851 and a second vacuum gate valve 852, the first vacuum gate valve is arranged in the docking and engagement mechanism, and the second vacuum gate valve is arranged between the transfer box housing and the docking and engagement mechanism. To be specific, the first vacuum gate valve and the second vacuum gate valve are respectively arranged at two ends of the vacuum pump opening/closing port, and the first vacuum gate valve and the second vacuum gate valve are arranged to adjust the internal vacuum degree of the docking and engagement mechanism.

The method for transferring the prepared cryo-electron microscopy samples specifically includes: Step A100: Open the vacuum gate valve arranged inside the vacuum docking mechanism, that is, open the first vacuum gate valve and the second vacuum gate valve, and activate the first power device, where the movement assembly is driven by the first power device to move along the longitudinal direction of the transmission rod to the first preset position, where an end of the transmission rod away from the first power device is docked with the transfer device at the first preset position, and the limiting slide block is fixedly engaged with the second transmission assembly. In the present invention, the engagement herein means that the two arc areas of the transmission rod respectively abut against the first protrusion of the first plunger spring body and the second protrusion of the second plunger spring body.

Step A200: Activate the second power device, the rotation assembly is driven by the second power device to rotate to the second preset position, where the end of the transmission rod away from the first power device is fixedly engaged with the transfer device at the second preset position. In this embodiment, to rotate by 90°, the two plane areas of the transmission rod respectively abut against the first protrusion of the first plunger spring body and the second protrusion of the second plunger spring body; the first limiting section and the second limiting section on the transmission rod ensure the transmission rod to be engaged with and fixed to the transfer device.

Step A300: Activate the first power device, where the transfer device carries the sample and is driven by the first power device to move away from the chamber of the sample preparation device to the chamber of the vacuum docking mechanism; specifically, the transfer device is driven by the transmission rod to move to the fixing base.

Step A400: Close the vacuum gate valve arranged inside the vacuum docking mechanism, to evacuate the chamber of the vacuum docking mechanism to keep the sample in a vacuum environment; specifically, first close the vacuum gate valve close to the sample preparation device, that is, the first vacuum gate valve, to evacuate the chamber, and then close the vacuum gate valve close to the first power device, that is, the second vacuum gate valve, to complete the vacuum environment adjustment of the space in which the sample is located.

Step A500: Control a lock switch of the docking and engagement mechanism in the vacuum docking mechanism, to disengage the vacuum docking mechanism from the outside of the chamber of the sample preparation device; specifically, first close the first vacuum gate valve and the second vacuum gate valve, fill the docking and engagement mechanism with air or argon gas, to control the lock switch of the docking and engagement mechanism in the vacuum docking mechanism, so that the vacuum docking mechanism is disengaged from the outer wall of the sample preparation device to become a movable transfer system.

Further, the docking and engagement mechanism moves to the next device according to requirements. After moving, the docking and engagement mechanism can be docked with the device and the device is evacuated. Then, open the vacuum gate valve, and the first power device drives the transmission rod to remove the transfer device from the fixing base and install it into the transfer table base of the corresponding device. After installation, the transmission rod is controlled by the rotation device to rotate by 90° to unlock the transmission rod from the transfer device for fixing the sample. The first power device drives the transmission rod to recover to the inside of the transfer rod slide rail of the transfer device, the vacuum gate valve is closed, and transferring to another device is completed.

In the present invention, the indirect connection between the first power device and the transmission rod enables the outer diameter of transfer rod slide rail for holding the transmission rod to be smaller, which is convenient for grasping during transfer.

Further, the first bottom wall and the second bottom wall constitute a lower step structure to ensure that the sample inside the second chamber is in a liquid nitrogen environment.

Further, in this embodiment, after the sample table is smeared with liquid glue, the sample is placed flat in the ultra-low temperature liquid tank, and then liquid nitrogen is used to rapidly freeze and fix the sample; after the sample is fixed to the sample table, they are loaded into the base, the adjustment and fixing base of the base pressing plate is used to adjust the vertical adjustment device, to adjust the cutter (namely, the saw blade) to the sample cutting position, turn on a high-frequency motor to make a saw blade rotate at a high speed (more than 6000 revolutions/min), and use a horizontal movement handle to control the translation cutter to cut the sample. It should be noted that the pressure does not exceed the preset pressure value during cutting. After cutting, the cutting mechanism is lift to replace the saw blade with a coarse sand disc, and the sand disc and the saw blade are ensured to be parallel. After the sand disc is replaced, a pressure sensor is pre-cooled and used to find the contact surface between the sand disc and the sample. After the contact surface is found, there are two options: First, turn on the high-frequency spindle and use the horizontal movement handle (that is, a rotation manual member 900 that is arranged in the horizontal adjustment device and that can drive the device to move, to manually adjust the position), to manually translate the cutting/polishing mechanism. When samples are polished, corresponding pressure should be maintained during polishing, and medium and fine sandpapers are the same as above. Second, under control of a principal computer, the horizontal movement mechanism records and sets a horizontal movement range of the cutting/polishing mechanism, and the vertical movement mechanism sets the sample thickness to be abraded each time (namely, the single drop) and the total thickness (namely, the total drop), and sets the speed of the high-frequency spindle and the upper limit of the polishing pressure. After the setting is completed, the high-frequency motor is activated to drive the sand disc to rotate, and the horizontal movement mechanism drives the sand disc to move back and forth, to polish the sample. When a pressure sensor value is less than a preset pressure value, the vertical movement mechanism moves down by a single drop and continues horizontal movement and polishing. When the pressure sensor is lower than the preset value again, the vertical movement mechanism moves down again by a single drop. When the total drop is equal to the preset total thickness, polishing ends. The above steps may be repeated for polishing through medium and fine sand discs. After the sample is polished, the top wire is loosened, a clamp such as tweezers are used to transfer the sample table to the sample table transfer mechanism, and then the sample transfer mechanism is used to transfer the sample to a corresponding position.

Figure 22:
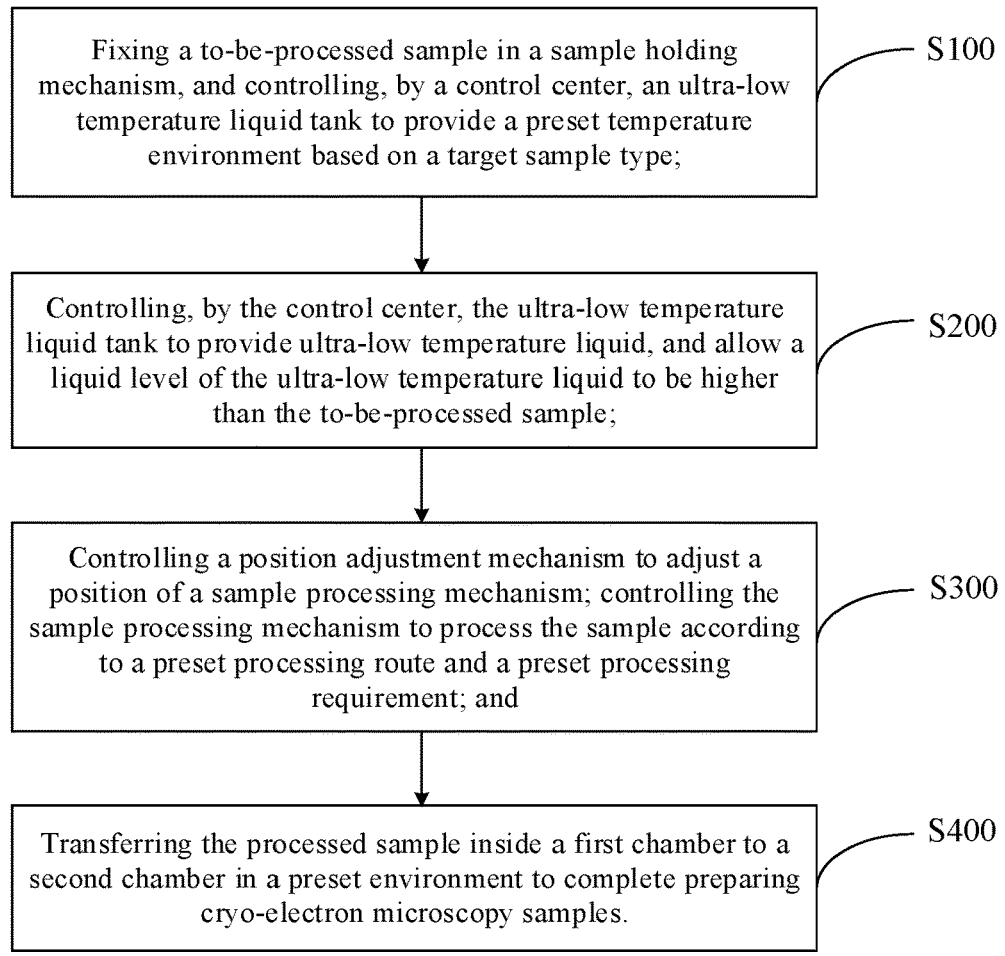
FIG. 22 is a logical diagram of a specific embodiment of an intelligent method for preparing cryo-electron microscopy samples according to the present invention.

Referring to FIG. 22, FIG. 22 is a logical diagram of a specific embodiment of an intelligent method for preparing cryo-electron microscopy samples in the present invention. A second aspect of the present invention provides an intelligent method for preparing cryo-electron microscopy samples. The method is based on the intelligent system for preparing cryo-electron microscopy samples and specifically includes the following steps: step S100: fixing a to-be-processed sample in the sample holding mechanism, and controlling, by the control center, the ultra-low temperature liquid tank to provide the preset temperature environment based on the target sample type; step S200: controlling, by the control center, the ultra-low temperature liquid tank to provide ultra-low temperature liquid, and allow a liquid level of the ultra-low temperature liquid to be higher than the to-be-processed sample; step S300: controlling the position adjustment mechanism to adjust the position of the sample processing mechanism; controlling the sample processing mechanism to process the sample according to the preset processing route and a preset processing requirement; and step S400: transferring the processed sample inside the first chamber to the second chamber in the preset environment to complete preparing the cryo-electron microscopy samples.

A third aspect of the present invention provides an electronic device, including: at least one processor and a memory communicating with the at least one processor, where instructions configured to be executed by the processor are stored in the memory, and the instructions are configured to be executed by the processor to implement the intelligent method for preparing cryo-electron microscopy samples.

It should be noted that in the description of the present invention, terms such as "central", "upper", "lower", "left", "right", "front", "rear", "inner" and "outer" indicate orientation or position relationships based on the accompanying drawings. They are merely intended to facilitate description, rather than to indicate or imply that the mentioned device or assemblies must have a specific orientation and must be constructed and operated in a specific orientation. Therefore, these terms should not be construed as a limitation to the present invention. Moreover, the terms such as "first", "second" and "third" are used only for the purpose of description and are not intended to indicate or imply relative importance.

It should be noted that in the description of the present invention, unless otherwise clearly specified, meanings of terms "install", "connect with" and "connect to" should be understood in a broad sense. For example, the connection may be a fixed connection, a removable connection, or an integral connection; may be a mechanical connection or an electrical connection; may be a direct connection or an indirect connection via a medium; or may be an internal connection between two assemblies. Those skilled in the art should understand the specific meanings of the above terms in the present invention based on specific situations.

In addition, terms "include", "comprise", or any other variations thereof are intended to cover non-exclusive inclusions, so that a process, an article, or a device/apparatus including a series of elements not only includes those elements, but also includes other elements that are not explicitly listed, or also includes inherent elements of the process, the article or the device/apparatus.

The technical solutions of the present invention are described with reference to the preferred implementations and accompanying drawings. Those skilled in the art should easily understand that the protection scope of the present invention is apparently not limited to these specific implementations. Those skilled in the art can make equivalent changes or substitutions to the relevant technical features without departing from the principles of the present invention, and the technical solutions after these changes or substitutions should fall within the protection scope of the present invention.

What is claimed is:

1. An intelligent system for preparing cryo-electron microscopy samples, comprising a control center, an ultra-low temperature liquid tank, a sample holding mechanism, a sample processing mechanism, a position adjustment mechanism and a sample transfer mechanism, wherein the ultra-low temperature liquid tank, the sample holding mechanism, the sample processing mechanism, the position adjustment mechanism and the sample transfer mechanism are signally connected to the control center;

the ultra-low temperature liquid tank comprises a liquid tank body for holding liquid nitrogen to provide an ultra-low temperature environment required for samples; the liquid tank body comprises a bottom wall and a side wall, and the bottom wall and the side wall constitute a chamber with an upward opening; the bottom wall comprises a first bottom wall and a second bottom wall, wherein the first bottom wall is provided with a first mounting portion for installing the sample holding mechanism, and the second bottom wall is provided with a second mounting portion matched with the sample transfer mechanism; a partition is arranged between the first bottom wall and the second bottom wall, wherein the partition and the first bottom wall constitute a first chamber, and the partition and the second bottom wall constitute a second chamber;

the sample holding mechanism is configured to limit a position of a to-be-processed sample; the sample transfer mechanism is configured to transfer a processed sample in a preset environment; the position adjustment mechanism is configured to adjust horizontal and vertical positions of the sample processing mechanism; the sample processing mechanism is configured to cut or polish the to-be-processed sample; and in a working process, the control center controls the ultra-low temperature liquid tank to provide a preset temperature environment based on a target sample type, activates the position adjustment mechanism based on position information of the sample holding mechanism in the first chamber to drive the sample processing mechanism to perform processing according to a preset processing route, and activates, based on information about the processed sample to be transferred into the second chamber, the sample transfer mechanism to transfer the processed sample in the preset environment.

2. The intelligent system according to claim 1, wherein the sample holding mechanism comprises a sample table, a base and a base pressing plate; the sample table comprises a disc carrier and a connecting rod; and the connecting rod is arranged below the disc carrier;

the base comprises a first disc-shaped structure and a second disc-shaped structure arranged below the first disc-shaped structure, and a horizontal area of the second disc-shaped structure is larger than a horizontal area of the first disc-shaped structure; a circular chamber for holding the disc carrier is arranged in the first disc-shaped structure, and a fixing portion matched with the connecting rod is arranged in the circular chamber;

a side of the first disc-shaped structure is provided with a first limiting through hole and a second limiting through hole, and the first limiting through hole is arranged opposite to the second limiting through hole; a first limiting member and a second limiting member are respectively arranged in the first limiting through hole and the second limiting through hole to clamp or loosen the disc carrier;

the first mounting portion is a protruding limiting groove, and the second disc-shaped structure is rotatably arranged in the protruding limiting groove; a first protruding shaft is arranged in a middle of the protruding limiting groove, and a limiting hole matched with the first protruding shaft is arranged at a bottom of the second disc-shaped structure; and the base pressing plate is installed on a top of the second disc-shaped structure to press or loosen the base.

3. The intelligent system according to claim 2, wherein the connecting rod is a threaded rod, and the fixing portion is a threaded hole;

the disc carrier is provided with a sample connecting groove, and a depth of the sample connecting groove is less than a thickness of the disc carrier; a longitudinal axis of the sample connecting groove and a longitudinal axis of the connecting rod are arranged at a preset angle;

the disc carrier is further provided with a plurality of clamping holes, a plurality of sample connecting grooves are arranged, and the plurality of clamping holes and the plurality of sample connecting grooves do not interfere with each other;

a side wall of the base pressing plate is provided with a first protruding portion and a second protruding portion, and the first protruding portion is arranged opposite to the second protruding portion; a thickness of the second protruding portion is less than a thickness of the first protruding portion; a side of the protruding limiting groove is provided with a third protruding portion and a fourth protruding portion, and the third protruding portion is arranged opposite to the fourth protruding portion; the first protruding portion abuts against the third protruding portion, and the second protruding portion and the fourth protruding portion are arranged with a gap; in a working state, the second protruding portion and the fourth protruding portion are connected through a bolt to press or loosen the base.

4. The intelligent system according to claim 1, wherein the position adjustment mechanism is installed on a top cover of the liquid tank body; the position adjustment mechanism comprises a horizontal adjustment device and a vertical adjustment device, and the horizontal adjustment device and the vertical adjustment device are signally connected to the control center;

the horizontal adjustment device comprises a horizontal movement assembly, a first power device and a first connecting assembly; the horizontal movement assembly comprises a first horizontal movement device and a second horizontal movement device, and the first horizontal movement device and the second horizontal movement device are respectively fixedly arranged at two ends of the first connecting assembly; the top cover of the liquid tank body is provided with a first horizontal guide rail matched with the first horizontal movement device, and a second horizontal guide rail matched with the second horizontal movement device; in the working state, the first horizontal movement device is driven by the first power device to move along the first horizontal guide rail, and to drive the second horizontal movement device to move along the second horizontal guide rail;

the vertical adjustment device comprises a vertical movement assembly, a second power device, and a second connecting assembly; the vertical movement assembly comprises a first lifting device and a second lifting device, and the first lifting device and the second lifting device are respectively arranged above the first horizontal movement device and the second horizontal movement device; the first lifting device comprises a first connecting and fixing portion, a screw rod, and a limiting and connecting portion; the first connecting and fixing portion is provided with a through hole threadedly matched with the screw rod; the second lifting device comprises a guide rail; a first end of the second connecting assembly is fixedly connected to the first connecting and fixing portion, and a second end of the second connecting assembly is engaged with the guide rail; in the working process, the screw rod is driven by the second power device to drive the first connecting and fixing portion to rise and fall to further control the second connecting assembly to rise and fall; and the sample processing mechanism is installed on the second connecting assembly.

5. The intelligent system according to claim 4, wherein the sample processing mechanism comprises a processing power device, a transmission device, a bracket, and a processing assembly; the transmission device is installed at a power output end of the processing power device; the transmission device is fixed to the bracket through the processing power device; the processing assembly is installed at a power output end of the transmission device;

the bracket has an engagement and fixing portion, and the sample processing mechanism is fixedly connected to the second connecting assembly through the engagement and fixing portion; a detection device is arranged on the bracket, and the detection device is a pressure detection device for detecting a working pressure or a torque detection device for detecting torque;

the processing assembly comprises a clamp and a cutter, and the cutter is installed on the transmission device through the clamp; the transmission device is driven by the processing power device to drive the cutter to cut or polish the to-be-processed sample.

6. The intelligent system according to claim 5, wherein a temperature detection device and a heating device are arranged on the bracket, and the temperature detection device and the heating device are signally connected to the control center; when temperature information detected by the temperature detection device exceeds a preset threshold, the control center activates the heating device to adjust a temperature of the sample processing mechanism.

7. The intelligent system according to claim 1, wherein a first temperature detection module is arranged inside the first chamber, and the first temperature detection module is signally connected to the control center to detect temperature information inside the first chamber;

an isolation cover is arranged on a top of the second chamber; a second temperature detection module and a temperature control module are arranged on the isolation cover, and the second temperature detection module and the temperature control module are signally connected to the control center; in the working process, the control center controls the temperature control module to perform temperature adjustment based on abnormal temperature information detected by the second temperature detection module.

8. The intelligent system according to claim 1, wherein the sample transfer mechanism comprises a sample fixing mechanism, a transmission mechanism and a vacuum docking mechanism, and the transmission mechanism and the vacuum docking mechanism communicate with the control center;

the sample fixing mechanism comprises a transfer table base and a transfer device; the second mounting portion is an inclined groove, and the transfer table base is fixed to the inclined groove; the transfer device is movably installed on a top of the transfer table base to fix the processed sample;

the transmission mechanism comprises a transmission rod, a movement device and a rotation device; the movement device comprises a first power device, a first transmission assembly, a transmission screw rod, a transfer rod slide rail, a movement slide block and a limiting slide block; the first transmission assembly is installed at a power output end of the first power device, and the transmission screw rod is installed at a power output end of the first transmission assembly; the transfer rod slide rail has a cylindrical structure, and the movement slide block and the limiting slide block are installed inside the cylindrical structure; the limiting slide block is rotatably connected to the transfer rod slide rail; the transmission rod penetrates the limiting slide block and is rotatably connected to the movement slide block; the transmission rod is fixedly connected to the limiting slide block; a side of the movement slide block is provided with a rail connecting portion, and an inner wall of the transfer rod slide rail is provided with a rail engagement portion matched with the rail connecting portion; a rotation engagement portion is arranged on a side of the limiting slide block, wherein the side of the limiting slide block is away from the movement slide block; the movement slide block is provided with a screw rod transmission portion matched with the transmission screw rod;

the rotation device comprises a second power device and a second transmission assembly, and the second transmission assembly is arranged at a power output end of the second power device; the second transmission assembly is provided with a rotation docking portion matched with the rotation engagement portion; the transmission rod penetrates the rotation docking portion;

the vacuum docking mechanism is hung on a front wall of the liquid tank body, and the vacuum docking mechanism is configured to provide an environment required for the samples and bear a transferred sample; the front wall of the liquid tank body is provided with a through hole for holding the transmission rod; the transfer power device is installed on a side of the vacuum docking mechanism, wherein the side of the vacuum docking mechanism is away from the liquid tank body;

in a first operation state, the movement slide block, the limiting slide block and the transmission rod constitute a movement assembly; in a second operation state, the limiting slide block is fixedly engaged with the second transmission assembly, and the transmission rod, the limiting slide block and the second transmission assembly constitute a rotation assembly;

in the first operation state, the movement assembly is driven by the first power device to move along a longitudinal direction of the transmission rod to a first preset position, wherein an end of the transmission rod is away from the first power device, and the end of the transmission rod is docked with the transfer device at the first preset position, and the limiting slide block is fixedly engaged with the second transmission assembly; in the second operation state, the rotation assembly is driven by the second power device to rotate to a second preset position, wherein the end of the transmission rod is fixedly engaged with the transfer device at the second preset position; in a third operation state, the transfer device carries the processed sample and is driven by the first power device to move away from a chamber of a sample preparation device to the vacuum docking mechanism.

9. An intelligent method for preparing cryo-electron microscopy samples, based on the intelligent system according to claim 1, comprising the following steps:

step S100: fixing the to-be-processed sample in the sample holding mechanism, and controlling, by the control center, the ultra-low temperature liquid tank to provide the preset temperature environment based on the target sample type;

step S200: controlling, by the control center, the ultra-low temperature liquid tank to provide ultra-low temperature liquid, and allow a liquid level of the ultra-low temperature liquid to be higher than the to-be-processed sample;

step S300: controlling the position adjustment mechanism to adjust the position of the sample processing mechanism; controlling the sample processing mechanism to process the sample according to the preset processing route and a preset processing requirement; and step S400: transferring the processed sample inside the first chamber to the second chamber in the preset environment to complete preparing the cryo-electron microscopy samples.

10. An electronic device, comprising: at least one processor and a memory communicating with the at least one processor, wherein instructions configured to be executed by the processor are stored in the memory, and the instructions are configured to be executed by the processor to implement the intelligent method according to claim 9.

11. The intelligent method according to claim 9, wherein the sample holding mechanism comprises a sample table, a base and a base pressing plate; the sample table comprises a disc carrier and a connecting rod; and the connecting rod is arranged below the disc carrier;

the base comprises a first disc-shaped structure and a second disc-shaped structure arranged below the first disc-shaped structure, and a horizontal area of the second disc-shaped structure is larger than a horizontal area of the first disc-shaped structure; a circular chamber for holding the disc carrier is arranged in the first disc-shaped structure, and a fixing portion matched with the connecting rod is arranged in the circular chamber;

a side of the first disc-shaped structure is provided with a first limiting through hole and a second limiting through hole, and the first limiting through hole is arranged opposite to the second limiting through hole; a first limiting member and a second limiting member are respectively arranged in the first limiting through hole and the second limiting through hole to clamp or loosen the disc carrier;

the first mounting portion is a protruding limiting groove, and the second disc-shaped structure is rotatably arranged in the protruding limiting groove; a first protruding shaft is arranged in a middle of the protruding limiting groove, and a limiting hole matched with the first protruding shaft is arranged at a bottom of the second disc-shaped structure; and the base pressing plate is installed on a top of the second disc-shaped structure to press or loosen the base.

12. The intelligent method according to claim 11, wherein the connecting rod is a threaded rod, and the fixing portion is a threaded hole;

the disc carrier is provided with a sample connecting groove, and a depth of the sample connecting groove is less than a thickness of the disc carrier; a longitudinal axis of the sample connecting groove and a longitudinal axis of the connecting rod are arranged at a preset angle;

the disc carrier is further provided with a plurality of clamping holes, a plurality of sample connecting grooves are arranged, and the plurality of clamping holes and the plurality of sample connecting grooves do not interfere with each other;

a side wall of the base pressing plate is provided with a first protruding portion and a second protruding portion, and the first protruding portion is arranged opposite to the second protruding portion; a thickness of the second protruding portion is less than a thickness of the first protruding portion; a side of the protruding limiting groove is provided with a third protruding portion and a fourth protruding portion, and the third protruding portion is arranged opposite to the fourth protruding portion; the first protruding portion abuts against the third protruding portion, and the second protruding portion and the fourth protruding portion are arranged with a gap; in a working state, the second protruding portion and the fourth protruding portion are connected through a bolt to press or loosen the base.

13. The intelligent method according to claim 9, wherein the position adjustment mechanism is installed on a top cover of the liquid tank body; the position adjustment mechanism comprises a horizontal adjustment device and a vertical adjustment device, and the horizontal adjustment device and the vertical adjustment device are signally connected to the control center;

the horizontal adjustment device comprises a horizontal movement assembly, a first power device and a first connecting assembly; the horizontal movement assembly comprises a first horizontal movement device and a second horizontal movement device, and the first horizontal movement device and the second horizontal movement device are respectively fixedly arranged at two ends of the first connecting assembly; the top cover of the liquid tank body is provided with a first horizontal guide rail matched with the first horizontal movement device, and a second horizontal guide rail matched with the second horizontal movement device; in the working state, the first horizontal movement device is driven by the first power device to move along the first horizontal guide rail, and to drive the second horizontal movement device to move along the second horizontal guide rail;

the vertical adjustment device comprises a vertical movement assembly, a second power device, and a second connecting assembly; the vertical movement assembly comprises a first lifting device and a second lifting device, and the first lifting device and the second lifting device are respectively arranged above the first horizontal movement device and the second horizontal movement device; the first lifting device comprises a first connecting and fixing portion, a screw rod, and a limiting and connecting portion; the first connecting and fixing portion is provided with a through hole threadedly matched with the screw rod; the second lifting device comprises a guide rail; a first end of the second connecting assembly is fixedly connected to the first connecting and fixing portion, and a second end of the second connecting assembly is engaged with the guide rail; in the working process, the screw rod is driven by the second power device to drive the first connecting and fixing portion to rise and fall to further control the second connecting assembly to rise and fall; and the sample processing mechanism is installed on the second connecting assembly.

14. The intelligent method according to claim 13, wherein the sample processing mechanism comprises a processing power device, a transmission device, a bracket, and a processing assembly; the transmission device is installed at a power output end of the processing power device; the transmission device is fixed to the bracket through the processing power device; the processing assembly is installed at a power output end of the transmission device;

the bracket has an engagement and fixing portion, and the sample processing mechanism is fixedly connected to the second connecting assembly through the engagement and fixing portion; a detection device is arranged on the bracket, and the detection device is a pressure detection device for detecting a working pressure or a torque detection device for detecting torque;

the processing assembly comprises a clamp and a cutter, and the cutter is installed on the transmission device through the clamp; the transmission device is driven by the processing power device to drive the cutter to cut or polish the to-be-processed sample.

15. The intelligent method according to claim 14, wherein a temperature detection device and a heating device are arranged on the bracket, and the temperature detection device and the heating device are signally connected to the control center; when temperature information detected by the temperature detection device exceeds a preset threshold, the control center activates the heating device to adjust a temperature of the sample processing mechanism.

16. The intelligent method according to claim 9, wherein a first temperature detection module is arranged inside the first chamber, and the first temperature detection module is signally connected to the control center to detect temperature information inside the first chamber;

an isolation cover is arranged on a top of the second chamber; a second temperature detection module and a temperature control module are arranged on the isolation cover, and the second temperature detection module and the temperature control module are signally connected to the control center; in the working process, the control center controls the temperature control module to perform temperature adjustment based on abnormal temperature information detected by the second temperature detection module.

17. The intelligent method according to claim 9, wherein the sample transfer mechanism comprises a sample fixing mechanism, a transmission mechanism and a vacuum docking mechanism, and the transmission mechanism and the vacuum docking mechanism communicate with the control center;

the sample fixing mechanism comprises a transfer table base and a transfer device; the second mounting portion is an inclined groove, and the transfer table base is fixed to the inclined groove; the transfer device is movably installed on a top of the transfer table base to fix the processed sample;

the transmission mechanism comprises a transmission rod, a movement device and a rotation device; the movement device comprises a first power device, a first transmission assembly, a transmission screw rod, a transfer rod slide rail, a movement slide block and a limiting slide block; the first transmission assembly is installed at a power output end of the first power device, and the transmission screw rod is installed at a power output end of the first transmission assembly; the transfer rod slide rail has a cylindrical structure, and the movement slide block and the limiting slide block are installed inside the cylindrical structure; the limiting slide block is rotatably connected to the transfer rod slide rail; the transmission rod penetrates the limiting slide block and is rotatably connected to the movement slide block; the transmission rod is fixedly connected to the limiting slide block; a side of the movement slide block is provided with a rail connecting portion, and an inner wall of the transfer rod slide rail is provided with a rail engagement portion matched with the rail connecting portion; a rotation engagement portion is arranged on a side of the limiting slide block, wherein the side of the limiting slide block is away from the movement slide block; the movement slide block is provided with a screw rod transmission portion matched with the transmission screw rod;

the rotation device comprises a second power device and a second transmission assembly, and the second transmission assembly is arranged at a power output end of the second power device; the second transmission assembly is provided with a rotation docking portion matched with the rotation engagement portion; the transmission rod penetrates the rotation docking portion;

the vacuum docking mechanism is hung on a front wall of the liquid tank body, and the vacuum docking mechanism is configured to provide an environment required for the samples and bear a transferred sample; the front wall of the liquid tank body is provided with a through hole for holding the transmission rod; the transfer power device is installed on a side of the vacuum docking mechanism, wherein the side of the vacuum docking mechanism is away from the liquid tank body;

in a first operation state, the movement slide block, the limiting slide block and the transmission rod constitute a movement assembly; in a second operation state, the limiting slide block is fixedly engaged with the second transmission assembly, and the transmission rod, the limiting slide block and the second transmission assembly constitute a rotation assembly;

in the first operation state, the movement assembly is driven by the first power device to move along a longitudinal direction of the transmission rod to a first preset position, wherein an end of the transmission rod is away from the first power device, and the end of the transmission rod is docked with the transfer device at the first preset position, and the limiting slide block is fixedly engaged with the second transmission assembly; in the second operation state, the rotation assembly is driven by the second power device to rotate to a second preset position, wherein the end of the transmission rod is fixedly engaged with the transfer device at the second preset position; in a third operation state, the transfer device carries the processed sample and is driven by the first power device to move away from a chamber of a sample preparation device to the vacuum docking mechanism.

\* \* \* \* \*